US012770676B2

(12) United States Patent
Lee et al.

(10) Patent No.: US 12,770,676 B2
(45) Date of Patent: Oct. 20, 2026

(54) COMPUTE-IN-MEMORY DEVICE AND OPERATING METHOD

(71) Applicant: TAIWAN SEMICONDUCTOR MANUFACTURING COMPANY, LTD., Hsinchu (TW)

(72) Inventors: Wait-Kit Lee, Hsinchu (TW); Katherine H. Chiang, Hsinchu (TW)

(73) Assignee: TAIWAN SEMICONDUCTOR MANUFACTURING COMPANY, LTD, Hsinchu (TW)

( * ) Notice: Subject to any disclaimer, the term of this patent is extended or adjusted under 35 U.S.C. 154(b) by 171 days.

(21) Appl. No.: 18/638,247

(22) Filed: Apr. 17, 2024

(65) Prior Publication Data

US 2025/0218501 A1 Jul. 3, 2025

Related U.S. Application Data

(60) Provisional application No. 63/615,378, filed on Dec. 28, 2023.

(51) Int. Cl.

| | |
|---|---|
| ***G11C 11/54*** | (2006.01) |
| ***G11C 11/4078*** | (2006.01) |
| ***G11C 11/408*** | (2006.01) |
| ***G11C 11/4096*** | (2006.01) |

(52) U.S. Cl.

CPC ...... *G11C 11/4096* (2013.01); *G11C 11/4078* (2013.01); *G11C 11/4085* (2013.01); *G11C 11/54* (2013.01)

(58) Field of Classification Search

CPC . G11C 11/54; G11C 11/4096; G11C 11/4074; G11C 11/4085; G11C 11/4094; G11C 11/418; G11C 11/419; G11C 5/147; G11C 7/04; G11C 8/08

See application file for complete search history.

(56) References Cited

U.S. PATENT DOCUMENTS

| | | | |
|---|---|---|---|
| 11,061,646 B2 | 7/2021 | Sumbul et al. | |
| 12,205,632 B2 | 1/2025 | Lin et al. | |
| 2019/0042199 A1* | 2/2019 | Sumbul | G11C 11/4094 |

(Continued)

FOREIGN PATENT DOCUMENTS

| | | |
|---|---|---|
| KR | 10-2021-0052388 | 5/2021 |
| KR | 10-2023-0059117 | 5/2023 |
| TW | 202303382 | 1/2023 |

OTHER PUBLICATIONS

Sehsadri, Vivek et al., "RowClone: Fast and Energy-Efficient In-DRAM Bulk Data Copy and Initialization", Micro—46, Dec. 7-11, 2013, David CA, 13 pages.

*Primary Examiner* — Mushfique Siddique

(74) *Attorney, Agent, or Firm* — Hauptman Ham, LLP

(57) ABSTRACT

A memory device includes a plurality of word lines, a bit line, a memory array, a control circuit, and a current summation circuit. The memory array includes a plurality of memory cells coupled to the bit line. Each of the plurality of memory cells includes an access transistor coupled to a corresponding word line among the plurality of word lines. The control circuit is configured to supply, correspondingly through the plurality of word lines, a plurality of word line voltages, different from each other, to the access transistors. The current summation circuit is configured to be coupled to the bit line, and to detect a bit line current on the bit line.

20 Claims, 11 Drawing Sheets

(56) References Cited

U.S. PATENT DOCUMENTS

| | | | | |
|---|---|---|---|---|
| 2019/0102170 | A1* | 4/2019 | Chen | G11C 7/16 |
| 2022/0028444 | A1* | 1/2022 | Papageorgiou | G06N 3/048 |
| 2022/0076737 | A1* | 3/2022 | Cosemans | G06F 17/16 |
| 2023/0041094 | A1* | 2/2023 | Huang | G11C 11/418 |
| 2023/0127502 | A1* | 4/2023 | Lin | G11C 11/4099<br>365/185.2 |
| 2023/0238055 | A1* | 7/2023 | Pasotti | G11C 13/0026<br>365/230.03 |
| 2023/0386566 | A1* | 11/2023 | Dhori | G06E 3/008 |
| 2024/0021242 | A1* | 1/2024 | Park | G11C 13/0026 |
| 2024/0303037 | A1* | 9/2024 | Castro | G06F 7/523 |
| 2024/0331762 | A1* | 10/2024 | Filipiak | G06F 7/5443 |

* cited by examiner

COMPUTE-IN-MEMORY DEVICE AND OPERATING METHOD

RELATED APPLICATION(S)

This application claims the benefit of U.S. Provisional Application No. 63/615,378, filed Dec. 28, 2023, which is herein incorporated by reference in its entirety.

BACKGROUND

Recent developments in the field of artificial intelligence have resulted in various products and/or applications, including, but not limited to, speech recognition, image processing, machine learning, natural language processing, or the like. Such products and/or applications often use neural networks to process large amounts of data for learning, training, cognitive computing, or the like. Memory devices configured to perform computing-in-memory (CIM) operations (also referred to herein as CIM memory devices) are usable neural network applications, as well as other applications. A CIM memory device includes a memory array configured to store weight data and/or input data to be used together in one or more CIM operations.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
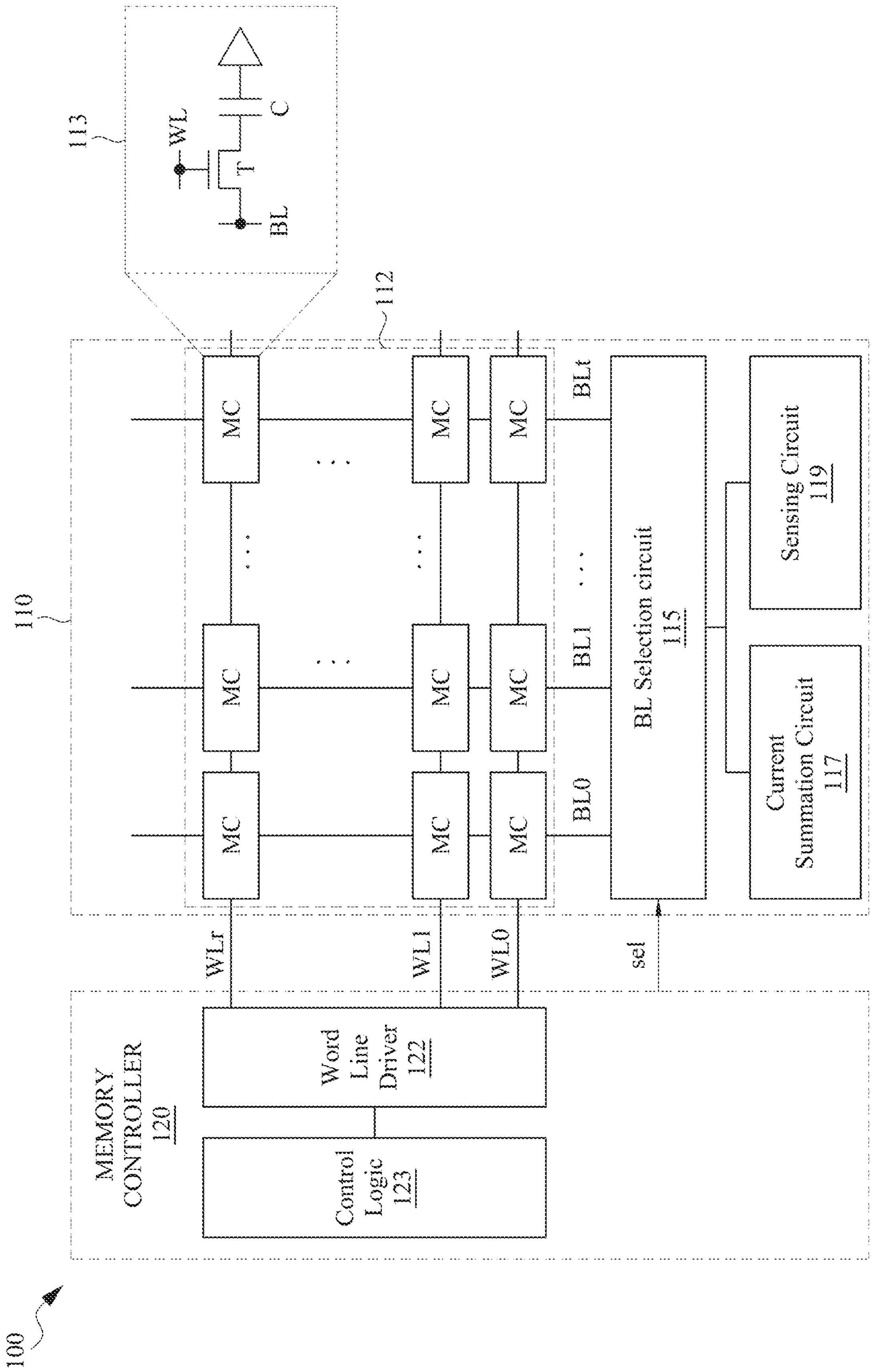
FIG. 1 is a schematic diagram of a memory device, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Source/drain(s) may refer to a source or a drain, individually or collectively dependent upon the context.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In certain situations, a CIM operation involves an analog signal obtained by performing a digital-to-analog conversion (DAC) operation to convert digital data into the analog signal. In some embodiments, a subthreshold region of access transistors in memory cells of a memory array is used in a DAC operation. For example, various gate voltages lower than a threshold voltage of the access transistors are supplied by a control circuit to gates of the access transistors. In response to the corresponding gate voltage, an individual current corresponding to a datum stored in each memory cell and the corresponding gate voltage is permitted to flow through each memory cell. The individual currents of the memory cells are collected on a bit line, and a summation of the individual currents is performed to obtain an analog signal. As a result, digital data stored in the memory cells are converted to the analog signal. In some embodiments, the described DAC operation is performed without requiring or involving one or more separate DAC circuits (i.e., digital-to-analog converters). In at least one embodiment, this is an improvement in at least of power consumption, chip area, or design simplicity, over other approaches which use or require separate DAC circuits to perform DAC operations.

In some embodiments, besides the described DAC operation, the memory array is configured to perform other operations, such as read operations, program operations (or write operations), without requiring changes to arrangements of bit lines and/or word lines in the memory array.

In some embodiments, considering that the subthreshold region of the access transistors is temperature-dependent, a temperature sensor is provided to detect a temperature of the memory array during operation. Based on the detected temperature and predetermined calibration data, the gate voltages supplied to the access transistors during a DAC operation are adjusted, to ensure accuracy of the DAC operation in one or more embodiments.

In some embodiments, the memory array comprises a specific region configured to perform DAC operations. Such a specific region is sometimes referred to as a DAC region. Digital data to be converted are stored in a different region, sometimes referred to as a data storage region, of the memory array, and are copied to the DAC region to be converted to analog signals. As a result, it is possible in one or more embodiments to avoid data disturb in the data storage region, and/or to simplify the described temperature-dependent adjustment. In some embodiments, one or more devices, methods, operations, advantages described herein are applicable or achievable in applications other than CIM applications.

FIG. 1 is a schematic diagram of a memory device 100, in accordance with some embodiments. A memory device is a type of an integrated circuit (IC) device. In at least one embodiment, a memory device is an individual IC device. In some embodiments, a memory device is included as a part of a larger IC device which comprises circuitry other than the memory device for other functionalities.

The memory device 100 comprises a memory macro 110 and a memory controller 120. The memory macro 110 comprises a memory array 112 of memory cells MC, a bit line (BL) selection circuit 115, a current summation circuit 117, and a sensing circuit 119. In some embodiments, the memory macro 110 further comprises one or more computation circuits configured to perform one or more CIM operations. An example of a computation circuit comprises a Multiply-Accumulate circuit (MAC). Other computation circuit configurations are within the scopes of various embodiments. In at least one embodiment, for an application other than a CIM application, computation circuits are omitted in the memory device 100. The memory controller 120 comprises a word line driver 122, and a control logic 123. The memory controller 120 is sometimes referred to as a control circuit. In some embodiments, one or more elements of the memory controller 120 are included in the memory macro 110, and/or one or more elements (except the memory array 112) of the memory macro 110 are included in the memory controller 120.

A macro has a reusable configuration and is usable in various types or designs of IC devices. In some embodiments, the macro is understood in the context of an analogy to the architectural hierarchy of modular programming in which subroutines/procedures are called by a main program (or by other subroutines) to carry out a given computational function. In this context, an IC device uses the macro to perform one or more given functions. Accordingly, in this context and in terms of architectural hierarchy, the IC device is analogous to the main program and the macro is analogous to subroutines/procedures. In some embodiments, the macro is a soft macro. In some embodiments, the macro is a hard macro. In some embodiments, the macro is a soft macro which is described digitally in register-transfer level (RTL) code. In some embodiments, synthesis, placement and routing have yet to have been performed on the macro such that the soft macro can be synthesized, placed and routed for a variety of process nodes. In some embodiments, the macro is a hard macro which is described digitally in a binary file format (e.g., Graphic Database System II (GDSII) stream format), where the binary file format represents planar geometric shapes, text labels, other information and the like of one or more layout-diagrams of the macro in hierarchical form. In some embodiments, synthesis, placement and routing have been performed on the macro such that the hard macro is specific to a particular process node.

A memory macro is a macro comprising memory cells which are addressable to permit data to be written to or read from the memory cells. In some embodiments, a memory macro further comprises circuitry configured to provide access to the memory cells and/or to perform a further function associated with the memory cells. For example, one or more weight buffers (not shown), one or more logic circuits (not shown) and one or more computation circuits (not shown) form circuitry configured to provide a CIM function associated with the memory cells MC in the memory macro 110. In at least one embodiment, a memory macro configured to provide a CIM function is referred to as a CIM macro. The described macro configuration is an example. Other configurations are within the scopes of various embodiments.

The memory cells MC are arranged in a plurality of columns and rows of the memory array 112. The memory controller 120 is electrically coupled to the memory cells MC and configured to control operations of the memory cells MC including, but not limited to, a read operation, a write operation, a DAC operation, a CIM operation, or the like.

The memory array 112 comprises a plurality of word lines (also referred to as "address lines") WL0, WL1 to WLr extending along a row direction (i.e., the horizontal direction in FIG. 1) of the rows, and a plurality of bit lines (also referred to as "data lines") BL0, BL1 to BLt extending along a column direction (i.e., the vertical direction in FIG. 1) of the columns, where r and t are natural numbers. The word lines are commonly referred to herein as WL, and the bit lines are commonly referred to herein as BL. The memory cells MC in each row are electrically coupled to the memory controller 120 by a corresponding word line. In some example operations, word lines are configured for transmitting addresses of the memory cells MC to be read from, or for transmitting addresses of the memory cells MC to be written to, or the like. In some example operations, bit lines are configured for transmitting data read from the memory cells MC indicated by corresponding word lines, or for transmitting data to be written to the memory cells MC indicated by corresponding word lines, or the like. In some embodiments, the memory array 112 further comprises a plurality of source lines (not shown) coupled to the memory cells MC along the rows or along the columns. Various numbers of word lines and/or bit lines and/or source lines in the memory array 112 are within the scope of various embodiments. In some embodiments, the memory cells MC are dynamic random-access memory (DRAM) cells, and the memory device 100 is a DRAM device.

An example DRAM configuration 113 for each memory cell MC is shown in FIG. 1. In the DRAM configuration 113, each memory cell MC comprises a transistor T and a capacitor C. A gate of the transistor T is coupled to a word line WL which corresponds to any of the word lines WL0, WL1 to WLr in the memory array 112. A first source/drain of the transistor is coupled to a bit line BL which corresponds to any of the bit lines BL0, BL1 to BLt in the memory array 112. A second source/drain of the transistor is coupled to one terminal of the capacitor C. The other terminal of the capacitor Cis coupled to a node of a reference voltage which, in the example configuration in FIG. 1, is the ground. The capacitor C is configured to store a datum of a logic state, e.g., logic "0" or logic "1." For example, when the capacitor C is charged, it stores logic "1." When the capacitor C is not charged, it stores logic "0." The transistor T, also referred to as an access transistor, is configured to permit access to the capacitor C and/or the datum stored therein, in an access operation. Examples of an access operation include, but are not limited to, a read operation, a write operation, a DAC operation, a CIM operation, or the like. In the DRAM configuration 113, the access transistor T is an N-type transistor. A P-type access transistor is possible in one or more embodiments. In the DRAM configuration 113, both reading from and writing to the capacitor C occur through the access transistor T. In other DRAM configurations with separate transistors for reading and writing, the transistor through which reading occurs is considered an access transistor. The described DRAM configuration 113 with one transistor and one capacitor is sometimes referred to as a 1T1C configuration. Other DRAM configurations are within the scopes of various embodiments.

In the example configuration in FIG. 1, the controller 120 comprises the word line driver 122, and the control logic 123. In some embodiments, the memory controller 120 further comprises one or more of a bit line driver, buffers, a pre-charging circuit, one or more clock generators for providing clock signals for various components of the memory device 100, global address decoder circuits, pre-decoder circuits, address latches, pulse generators, timing circuits, one or more input/output (I/O) circuits for data, address, clock and/or control exchange with external circuitry, one or more sub-controllers for controlling various operations in the memory device 100, or the like.

The word line driver 122 is coupled to the memory array 112 via the word lines WL. The word line driver 122 is configured to decode a row address of the memory cell MC selected to be accessed in an access operation. The word line driver 122 is sometimes referred to as a word line decoder. The word line driver 122 is configured to supply a voltage to the selected word line WL corresponding to the decoded row address, and a different voltage to the other, unselected word lines WL. In at least one embodiment, the word line driver 122 comprises one or more driving circuits or inverters.

A bit line driver (not shown) is coupled to the memory array 112 via the bit lines BL. In some embodiments, the bit line driver is part of the memory macro 110 and/or is coupled to the bit lines BL through the BL selection circuit 115. The bit line driver is configured to decode a column address of the memory cell MC selected to be accessed in an access operation. The bit line driver is sometimes referred to as a bit line decoder. The bit line driver 124 is configured to supply a voltage to the selected bit line BL corresponding to the decoded column address, and a different voltage to the other, unselected bit lines BL. In at least one embodiment, the bit line driver comprises one or more driving circuits or inverters. In some embodiments, the memory controller 120 further comprises a source line driver (not shown) coupled to the memory cells MC via source lines (not shown). In one or more embodiments, one or more of the word line driver 122, the bit line driver, the source line driver are part of circuitry referred to as a read/write driver or a read/write decoder.

The control logic 123 is an example of one or more sub-controllers included in the memory controller 120, and configured to control other components and various operations in the memory device 100. In the example configuration in FIG. 1, the control logic 123 is coupled to the word line driver 122 and is configured to control the word line driver 122 in an access operation, including a DAC operation and/or CIM operation as described herein. The control logic 123, or one or more further sub-controllers of the memory controller 120, is/are coupled to and configured to control one or more of the BL selection circuit 115, the current summation circuit 117, the sensing circuit 119, a bit line driver, buffers, computation circuits, I/O circuits, or the like, to coordinate operations of these circuits, drivers and/or buffers in such an access operation of the memory device 100. In one or more embodiments, the control logic 123 comprises a circuit of one or more of transistors, switches, logic gates, multiplexers, flip-flops, latches, or the like.

The BL selection circuit 115 is configured to selectively couple one or more of the bit lines BL to one of the current summation circuit 117 and the sensing circuit 119. In some embodiments, the BL selection circuit 115 is configured to switch among the current summation circuit 117, the sensing circuit 119 and a bit line driver. In at least one embodiment, the BL selection circuit 115 is configured to have a switched state in which one or more of the bit lines BL are not coupled to any of the current summation circuit 117, the sensing circuit 119, and a bit line driver. The BL selection circuit 115 is coupled to the memory controller 120 which is configured to output a control signal Se1 to the BL selection circuit 115 to control switching of the BL selection circuit 115. In one or more embodiments, the BL selection circuit 115 comprises a switch, a transistor, a multiplexer, or the like. The memory controller 120 is configured to supply the control signal Se1 to a gate or a control terminal/pin/input of the BL selection circuit 115.

The current summation circuit 117 is configured to perform a summation of a bit line current on a bit line coupled to the current summation circuit 117 by the BL selection circuit 115, in a DAC operation as described herein. In some embodiments, the current summation circuit 117 comprises an integrator circuit. An example integrator circuit is described with respect to FIG. 8D. Other configurations of the current summation circuit 117 are within the scopes of various embodiments.

The sensing circuit 119 is configured to perform a read operation, when coupled to a bit line by the BL selection circuit 115. In some embodiments, the sensing circuit 119 comprises a sense amplifier configured to determine a datum stored in a selected memory cell MC based on a read current on the bit line coupled to the selected memory cell MC and the sense amplifier. In at least one embodiment, the sensing circuit 119 further comprises a buffer for temporarily storing the read datum. Example buffers include, but are not limited to, registers, memory cells, or other circuit elements configured for data storage. Other configurations of the sensing circuit 119 and/or buffers are within the scopes of various embodiments. The described memory circuit configuration is an example, and other memory circuit configurations are within the scopes of various embodiments.

Figure 2:
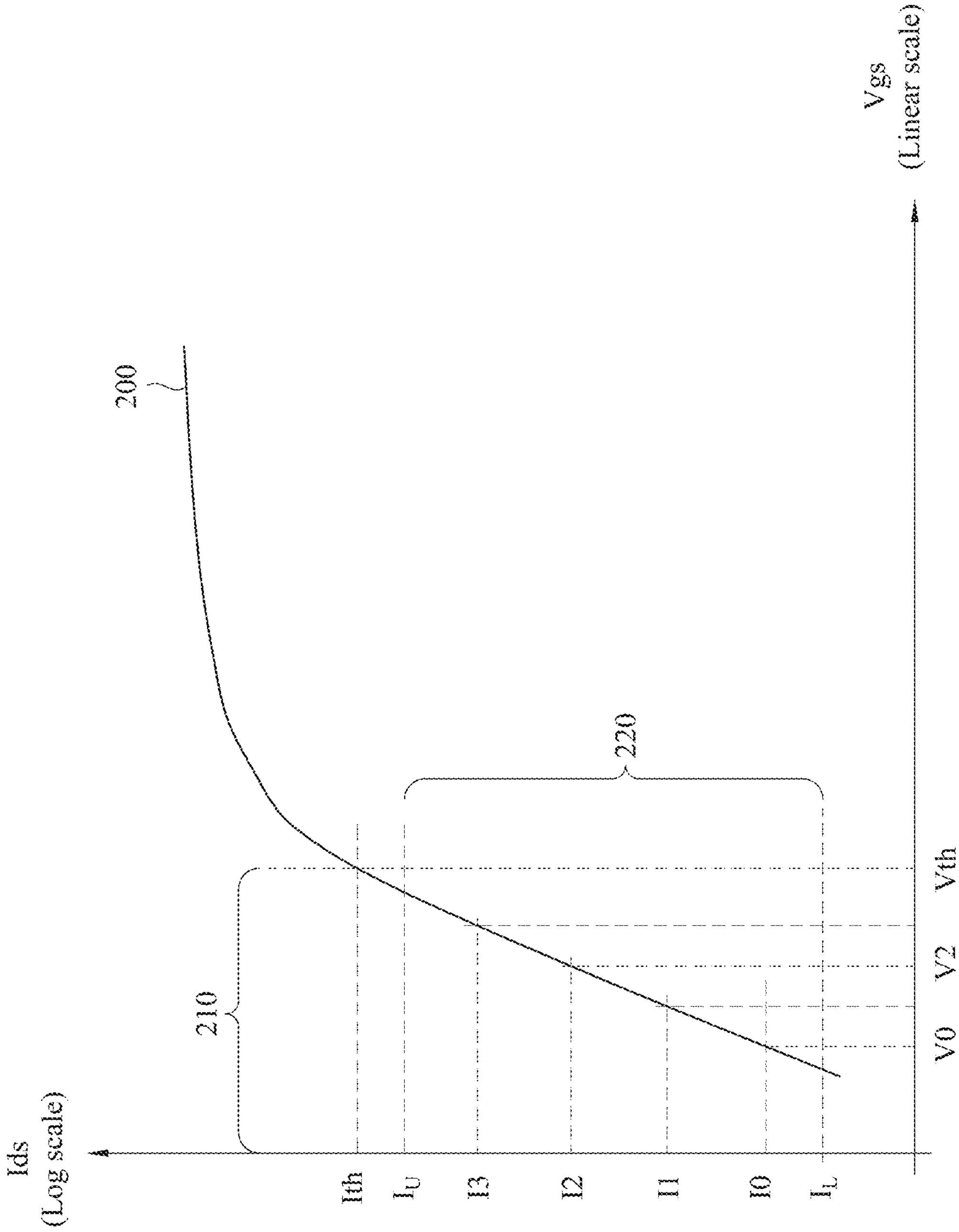
FIG. 2 is a graph showing a current-voltage characteristic of a transistor, in accordance with some embodiments.

FIG. 2 is a graph showing a current-voltage characteristic 200 of a transistor, in accordance with some embodiments. In some embodiments, the transistor with the current-voltage characteristic 200 corresponds to the access transistor T of any one or more of the memory cells MC in FIG. 1.

In the current-voltage characteristic 200, the horizontal axis indicates a voltage between the gate and the source of the access transistor T, also referred to herein as a gate voltage. The gate voltage is labelled as Vgs, and is shown in the linear scale in FIG. 2. The vertical axis indicates a current between the drain and the source of the access transistor T, also referred to herein as a channel current. The channel current is labelled as Ids, and is shown in the logarithmic scale (Log scale) in FIG. 2.

When the gate voltage Vgs of the access transistor Tis at or above a threshold voltage Vth, the access transistor T is turned ON. When the gate voltage Vgs of the access transistor T is below the threshold voltage Vth, the access transistor T is turned OFF. A current value of the channel current Ids at the threshold voltage Vth is a threshold voltage current Ith. The current-voltage characteristic 200 has a subthreshold region 210 below the threshold voltage Vth. In the subthreshold region 210, although the access transistor T is turned OFF, there is a small amount of the channel current Ids flowing through the access transistor T. Such a small amount of the channel current Ids is sometimes referred to as a leakage current. In a non-limiting example, the leakage current in the subthreshold region 210 is 1 μA (uA, or microampere, or $10^{-6}$ A) and below.

The subthreshold region 210 of the current-voltage characteristic 200 comprises a linear region 220 in which the channel current Ids (in the logarithmic scale) increases linearly with an increase of the gate voltage Vgs. The actual current value (in the linear scale) of the channel current Ids in the linear region 220 increases exponentially with the increase of the gate voltage Vgs. The linear region 220 varies from one transistor to another transistor, depending on various factors including, but not limited to, sizes, materials, manufacturing processes, or the like, of the transistors. In the example configuration in FIG. 2, the linear region 220 is defined between an upper limit $I_U$ and a lower limit $I_L$ of the channel current Ids. In some embodiments, the upper limit $I_U$ is below the threshold voltage current Ith by a few nA (nanoampere, or $10^{-9}$ A) to a few hundreds nA. In at least one embodiment, the lower limit $I_L$ is at, or higher than, a current noise level of the access transistor T. In a non-limiting example, the current noise level is 1 pA (picoampere, or $10^{-12}$ A).

In some embodiments, the linear region 220 in the subthreshold region 210 of the access transistor T is to perform a DAC operation. For example, as shown in FIG. 2, when a gate voltage V0, V1, V2, V3, or the like, within the linear region 220, is supplied to the gate of the access transistor T, the access transistor T remains turned OFF, but a corresponding channel current, or leakage current, I0, I1, I2, I3, or the like, is permitted to flow through the access transistor T. In some embodiments, the same, predetermined voltage difference is between V0 and V1, between V1 and V2, between V2 and V3, or the like. As a result, V0, V1, V2, V3, or the like, are different from each other by multiples of the predetermined voltage difference. For example, assuming the predetermined voltage difference is b (mV, or millivolt), V0 differs from V1 by b, from V2 by 2×b, from V3 by 3×b, or the like.

In some embodiments, V0, V1, V2, V3, or the like, are predetermined such that each leakage current among I0, I1, I2, I3, or the like, is k times greater or smaller than another leakage current among I0, I1, I2, I3, or the like. For example, I1=k×I0, I2=k×I1, I3=k×I2, or the like. In some embodiments, k is 2, resulting in I1=2×I0, I2=4×I0, I3=8×I0, or the like. This value of k=2 is used for an example DAC operation described with respect to FIG. 3A. Other values of k for DAC operations are within the scopes of various embodiments.

In some embodiments, the same, predetermined voltage difference b between V0 and V1, between V1 and V2, between V2 and V3, or the like, results in I1=k×I0, I2=k×I1, I3=k×I2, or the like. In at least one embodiment, a voltage value of the voltage difference b between adjacent gate voltages among V0, V1, V2, V3, or the like, that results in a specific value of k between adjacent leakage currents among I0, I1, I2, I3, or the like, corresponds to a slope of the linear region 220 in the current-voltage characteristic 200, and is sometimes referred to as the slope of the linear region 220 or the subthreshold slope. The described numbers of four gate voltages V0, V1, V2, V3, and four corresponding leakage currents I0, I1, I2, I3 are examples. Other numbers of gate voltages and corresponding leakage currents are within the scopes of various embodiments.

In at least one embodiment, the current-voltage characteristic 200 is predetermined by measuring current values of the channel current Ids at different voltage values of the gate voltage Vgs for an actual transistor. In some embodiments, the current-voltage characteristic 200 is predetermined by a simulation executed by a computer system. In some embodiments, based on the predetermined current-voltage characteristic, especially based on a linear region in the subthreshold region of the current-voltage characteristic, V0, V1, V2, V3, or the like, and corresponding I0, I1, I2, I3, or the like, are predetermined by one or more of actual measurements, simulation results, interpolation, extrapolation, or the like. A process of predetermining a set of V0, V1, V2, V3, or the like, and corresponding I0, I1, I2, I3, or the like, for a transistor is sometimes referred to as a calibration process. In some embodiments, a database is developed in advance and stores various sets of V0, V1, V2, V3, or the like, and corresponding I0, I1, I2, I3, or the like, for different transistors which differ from each other in one or more of sizes, materials, manufacturing processes, or the like. Such a database is stored in a non-transitory computer-readable storage medium and is consulted, e.g., during a design stage of a memory device, to configure a control circuit of the memory device to control a DAC operation in a memory array of the memory device, as described herein.

Figure 3B:
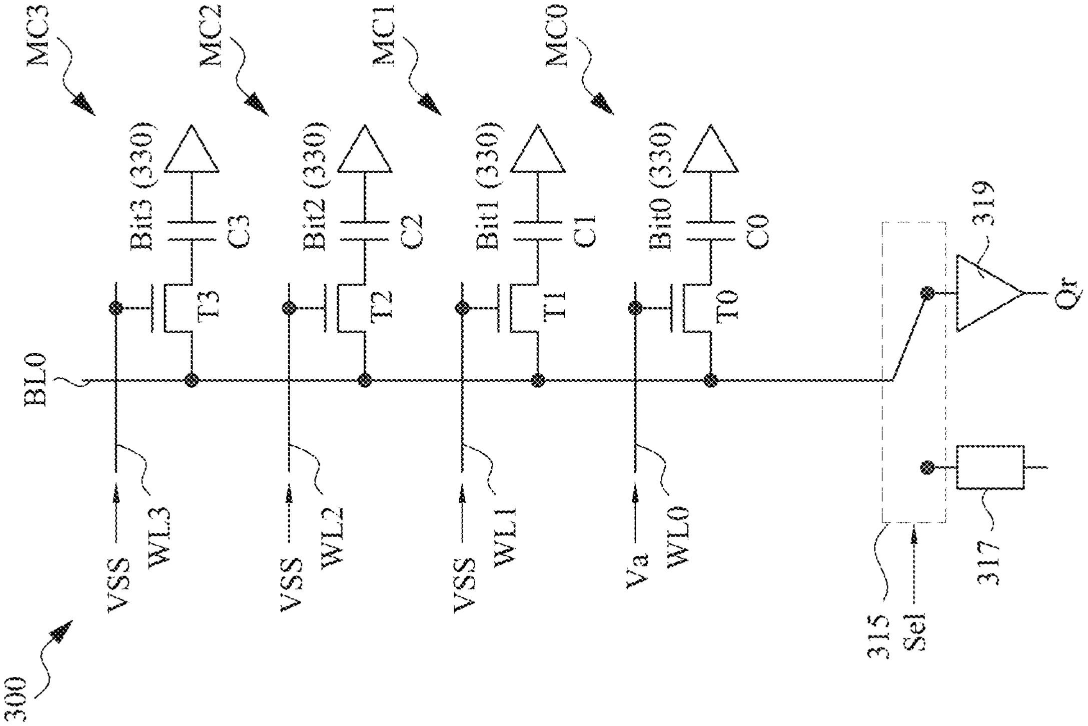
FIGS. 3A and 3B are schematic circuit diagrams of a section of a memory device in various operations, in accordance with some embodiments.
Figure 3A:
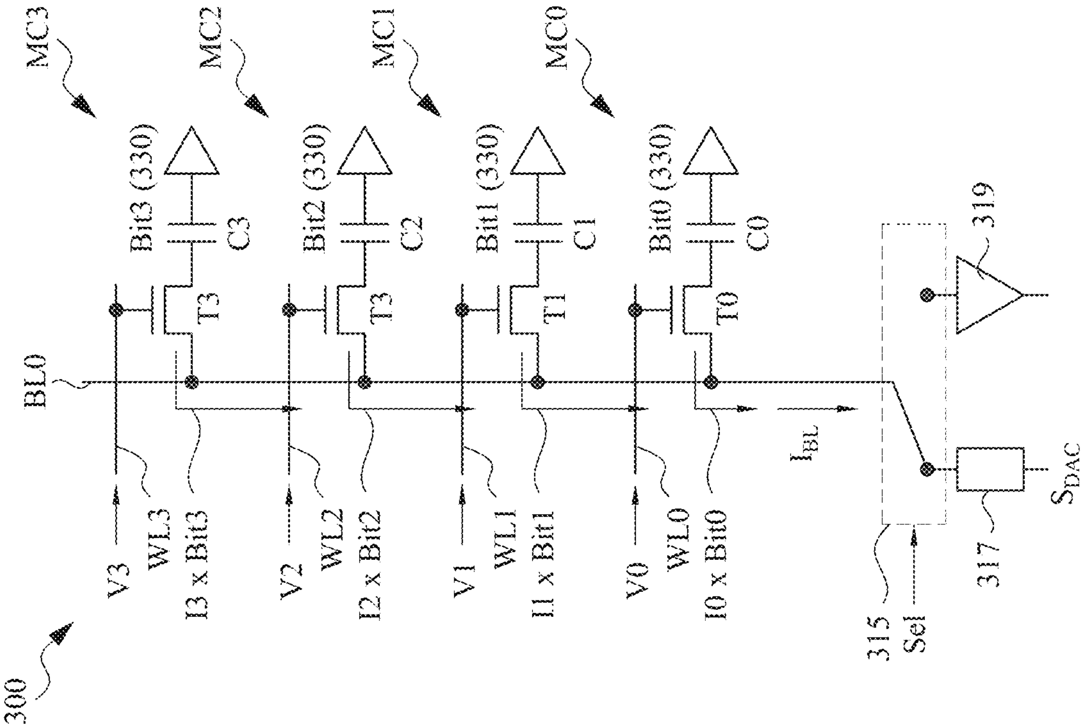

FIG. 3A is a schematic circuit diagram of a section of a memory device 300 in a DAC operation, in accordance with some embodiments. In at least one embodiment, the memory device 300 corresponds to the memory device 100.

The memory device 300 in FIG. 3A comprises memory cells MC0-MC3 coupled to a bit line BL0, and correspondingly coupled to word lines WL0-WL3. The memory device 300 further comprises a BL selection circuit 315 configured to, in response to a control signal Se1, selectively couple the bit line BL0 to a current summation circuit 317 or a sensing circuit 319. In a DAC operation, the BL selection circuit 315 couples the bit line BL0 to the current summation circuit 317, as shown in FIG. 3A. The memory cells MC0-MC3 has the described DRAM configuration 113, and correspondingly comprise access transistors T0-T3 and capacitors C0-C3. In at least one embodiment, the word lines WL0-WL3, bit line BL0, memory cells MC0-MC3, access transistors T0-T3, capacitors C0-C3, BL selection circuit 315, current summation circuit 317, sensing circuit 319 correspond to the described word lines, bit lines, memory cells, access transistors, capacitors, BL selection circuit 115, current summation circuit 117, sensing circuit 119 in the memory device 100. As schematically shown in the example configuration in FIG. 3A, the sensing circuit 319 comprises a sense amplifier. In some embodiments, the access transistors T0-T3 have a current-voltage characteristic corresponding to the current-voltage characteristic 200.

In the example configuration in FIG. 3A, digital data 330 stored in the memory cells MC0-MC3 are to be converted to an analog signal in a DAC operation. Each of the memory cells MC0-MC3 stores a corresponding datum, or bit, Bit0-Bit3 of the data 330 in the corresponding capacitor C0-C3. Each of Bit0-Bit3 is logic "0" (e.g., the corresponding capacitor is not charged) or logic "1" (e.g., the corresponding capacitor is charged). Bit0-Bit3 are arranged in order of significance in the data 330. For example, Bit0 is the least significant bit, Bit1 is higher than Bit0, Bit2 is higher than Bit1, Bit3 is higher than Bit2 and is the most significant bit.

To convert the data 330 to an analog signal, the bit line BL0 is biased to a predetermined voltage, e.g., VSS or 0 V.

Different word line voltages V0-V3 are supplied, e.g., by a word line driver (not shown) of the memory device 300 and through the corresponding word lines WL0-WL3, to the gates of the corresponding access transistors T0-T3. The word line voltages V0-V3 correspond to gate voltages V0-V3 described with respect to FIG. 2, and are in the subthreshold region of the current-voltage characteristic of the access transistors T0-T3. The access transistors T0-T3 remain turned OFF. However, leakage currents I0-I3 of different current values corresponding to different voltage values of the word line voltages V0-V3 are permitted to flow through the corresponding access transistors T0-T3. An individual current of each of the memory cells MC0-MC3, that actually flows to the bit line BL0, depends on the corresponding leakage current I0-I3 of the corresponding access transistor T0-T3 and the datum stored in the corresponding capacitor C0-C3. Specifically, an individual current of the memory cell MC0 that flows through the access transistor T0 to the bit line BL0 is I0×Bit0, an individual current of the memory cell MC1 that flows through the access transistor T1 to the bit line BL0 is I1×Bit1, an individual current of the memory cell MC2 that flows through the access transistor T2 to the bit line BL0 is I2×Bit2, and an individual current of the memory cell MC3 that flows through the access transistor T3 to the bit line BL0 is I3×Bit3. As a result, a bit line current $I_{BL}$ being the sum of the individual currents of the memory cells MC0-MC3 flows on the bit line BL0, through the BL selection circuit 315, to the current summation circuit 317, namely, $$I_{BL}=I0\times\mathrm{Bit}0+I1\times\mathrm{Bit}1+I2\times\mathrm{Bit}2+I3\times\mathrm{Bit}3.$$

In a non-limiting example, the data 330 include binary "1101", i.e., Bit3 is logic "1", Bit2 is logic "1", Bit1 is logic "0", and Bit0 is logic "1". For Bit3, Bit2, Bit0 being logic "1", the corresponding capacitors C3, C2, C0 are charged, and charged voltages of the charged capacitors C3, C2, C0 cause the corresponding individual currents I3 (i.e., I3×Bit3=I3×1=I3), I2 (i.e., I2×Bit2=I2×1=I2), I0 (i.e., I0×Bit0=I0×1=I0) to flow to the bit line BL0. For Bit1 being logic "0", the corresponding capacitor C1 is not charged, and the corresponding individual current is zero (i.e., I1×Bit1=I1×0=0). As a result, the bit line current $I_{BL}$=I3+I2+I0. In some embodiments with k=2 as described with respect to FIG. 2, I3=8×I0 and I2=4×I0, resulting in $I_{BL}$=8×I0+4×I0+I0=13×I0. The current value 13×I0 of the bit line current $I_{BL}$ corresponds to the decimal value 13 of the binary number "1101" in the data 330.

The bit line current $I_{BL}$ is an example of an analog signal to which the data 330 are converted in the described DAC operation. In at least one embodiment, the bit line current $I_{BL}$ is considered a result of the DAC operation and/or is usable directly for further processing. In the example configuration in FIG. 3A, the bit line current $I_{BL}$ is supplied through the BL selection circuit 315 to the current summation circuit 317. The current summation circuit 317 is configured to generate an analog signal $S_{DAC}$ which corresponds to the bit line current $I_{BL}$, and therefore, is also considered a result of the DAC operation. In some embodiments, the analog signal $S_{DAC}$ has a voltage value corresponding to the current value (e.g., 13×I0 in the above described example) of the bit line current $I_{BL}$. In some situations, although both the current value of the bit line current $I_{BL}$ and the voltage value of the analog signal $S_{DAC}$ correspond to the data 330, it is easier in subsequent processing to use the voltage value of the analog signal $S_{DAC}$ than to use the current value of the bit line current $I_{BL}$. An example circuit of the current summation circuit 317 is described with respect to FIG. 8D.

In some embodiments, the described DAC operation involves a number of memory cells equal to the number of bits in the digital data to be converted, without requiring a separate DAC circuit. This is an improvement over other approaches which, besides the memory cells storing the digital data to be converted, also requires one or more separate DAC circuits. In some situations, such separate DAC circuits include an additional array of memory cells that occupies a significant chip area. For example, to convert 4 bits of data, e.g., Bit0-Bit3 as described above, the separate DAC circuits or, DAC array, in accordance with other approaches require at least 8 memory cells for Bit3, 4 memory cells for Bit2, 2 memory cells for Bit1, and one memory cell for Bit0. Thus, a total of 15 (i.e., 8+4+2+1=15) additional memory cells is required in accordance with the other approaches, besides the four memory cells storing the digital data to be converted. In addition, the routing of memory cells in the DAC circuits or DAC array in accordance with other approaches is different from that of a memory array, such as the memory array 112. This different routing requires additional efforts in the designing and/or manufacturing processes. Such additional memory cells, DAC array, or additional designing and/or manufacturing efforts are not required in a memory device configured to perform the described DAC operation in accordance with one or more embodiments. As a result, it is possible in one or more embodiments to reduce the circuit complexity, power consumption and chip area.

To perform a DAC operation in accordance with some embodiments, it is sufficient to predetermine, for access transistors of memory cells in a memory device, a current-voltage characteristic and/or its subthreshold region and/or or various gate voltages (e.g., V0-V3) in the subthreshold region, and to configure a control circuit of the memory device to supply the predetermined gate voltages (e.g., V0-V3) to the access transistors in a DAC operation, as described. A re-arrangement of bit lines and/or word lines is not required in one or more embodiments. In some embodiments, a BL selection circuit already exists for switching between a sensing circuit and a bit line driver, and therefore, it is sufficient to make a simple change to the configuration of the BL selection circuit to additionally switch to a current summation circuit. In at least one embodiment, the current summation circuit comprises an integrator circuit which, if not already included in the memory device, occupies a much smaller area than separate DAC circuits required by the other approaches. Thus, a DAC operation in accordance with some embodiments requires minimal changes to an existing memory device design and even reduces complexity of the memory device, e.g., by omitting, or not requiring, separate DAC circuits.

FIG. 3B is a schematic circuit diagram of the section of the memory device 300 in a read operation, in accordance with some embodiments.

In the example in FIG. 3B, the memory cell MC0 is selected to be read from in the read operation. The control circuit of the memory device 300 controls the BL selection circuit 315, by an appropriate control signal Se1, to couple the sensing circuit 319 to the bit line BL0 which is coupled to the selected memory cell MC0. The control circuit of the memory device 300 further controls a pre-charging circuit to pre-charge the bit line BL0 to a pre-charged voltage between a power supply voltage (e.g., VDD) and a reference voltage (e.g., VSS or ground). In an example, the pre-charged voltage is VDD/2. Other bit lines (not shown), which are not selected for this read operation, are grounded or floating. In some embodiments, multiple memory cells are accessed in the same read operation, and multiple corresponding bit lines are coupled to corresponding sense amplifiers in the sensing circuit 319 and are pre-charged. The control circuit further controls the word line driver of the memory device 300 to supply, to the word line WL0 coupled to the selected memory cell MC0, a read voltage, or access voltage, Va. The access voltage Va is equal to or higher than the threshold voltage Vth of the access transistor T0 of the memory cell MC0, to turn ON the access transistor T0. In an example, the access voltage Va is VDD which is greater than the threshold voltage Vth. Other word lines, which are not selected for this read operation, are grounded or floating. In some embodiments, multiple memory cells are accessed in the same read operation, and the access voltage Va is supplied to multiple corresponding word lines. In some embodiments, all memory cells coupled to the word line WL0 are accessed in the same read operation, and all corresponding bit lines are coupled to corresponding sense amplifiers.

As the access transistor T0 is turned ON, the pre-charged voltage on the bit line BL0 changes in accordance with the charging state of the capacitor C0 datum stored in the memory cell MC0. For example, when the memory cell MC0 stores logic "1", the capacitor C0 is charged with a charged voltage VDD between its terminals. As a result, the pre-charged voltage on the bit line BL0 is increased by the charged voltage from VDD/2 toward VDD. In this process, the capacitor C0 looses at least part of its charge. In the sensing circuit 319, a sense amplifier coupled to the bit line BL0 detects and amplifiers the voltage increase on the bit line BL0, and outputs a read signal Qr having a voltage VDD indicating that the datum, or bit, read from the memory cell MC0 is logic "1". In this amplifying process, the sense amplifier 319 also supplies VDD to the bit line BL0 to restore the capacitor C0 back to the charged state with the charged voltage VDD between its terminals, i.e., to rewrite the read out logic "1" back to the memory cell MC0.

When the memory cell MC0 stores logic "0", the capacitor C0 is not charged, or is discharged, with no charged voltage between its terminal. As a result, the pre-charged voltage on the bit line BL0 is decreased from VDD/2 toward VSS. In this process, the capacitor C0 is partly charged. In the sensing circuit 319, the sense amplifier coupled to the bit line BL0 detects and amplifiers the voltage decrease on the bit line BL0, and outputs a read signal Qr having a voltage VSS indicating that the datum, or bit, read from the memory cell MC0 is logic "0". In this amplifying process, the sense amplifier 319 also supplies VSS to the bit line BL0 to discharge any charges accumulated in the capacitor C0 due to the read operation, and to restore the capacitor C0 back to the discharged state with no charged voltage between its terminals, i.e., to rewrite the read out logic "0" back to the memory cell MC0. In some embodiments, the described read operation is performed periodically for all memory cells, not to output data from the memory cells, but to refresh the data stored therein. A reason is that capacitors in memory cells potentially loose their charges, and stored data, over time.

In a write operation of the memory cell MC0, a write circuit or a bit line driver is coupled, by the BL selection circuit 315, to the corresponding bit line BL0. The access voltage Va is supplied to the gate of the access transistor T0 to turn ON the access transistor T0. To write logic "1" to the memory cell MC0, the write circuit or bit line driver supplies VDD to the bit line BL0 to charge the corresponding capacitor C0 to the charged voltage VDD between its terminals. To write logic "0" to the memory cell MC0, the bit line BL0 is grounded to discharge any charges in the capacitor C0, and bring the capacitor C0 to the discharged state with no charged voltage between its terminals.

In some embodiments, read operations and write operations in the memory device 300 are not affected by the ability/functionality of the memory device 300 to also perform DAC operations. As a result, it is possible in one or more embodiments to convert, with minimal efforts, a design of an existing memory device into one configured to perform DAC operations in accordance with some embodiments, without changes to the functionality, e.g., read operations and write operations, of the existing memory device.

In some situations, at least one of the current-voltage characteristic 200, the subthreshold region 210, or the linear region 220 described with respect to FIG. 2 is temperature-dependent, and changes with an operational temperature of the memory array or the access transistors therein. For example, as the slope of the linear region 220 changes, a same set of gate voltages or word line voltages, e.g., V0-V3, or the like, supplied to the gates of the access transistors in a DAC operation would result in different sets of leakage currents, e.g., I0-I3. Such changes in the leakage currents cause changes in the bit line current $I_{BL}$ and potentially cause an inaccuracy in a result of the DAC operation. In some embodiments described, e.g., with respect to FIG. 4, a memory device is configured to provide a compensation for a potentially undesirable effect of the described temperature-dependent situation.

Figure 4:
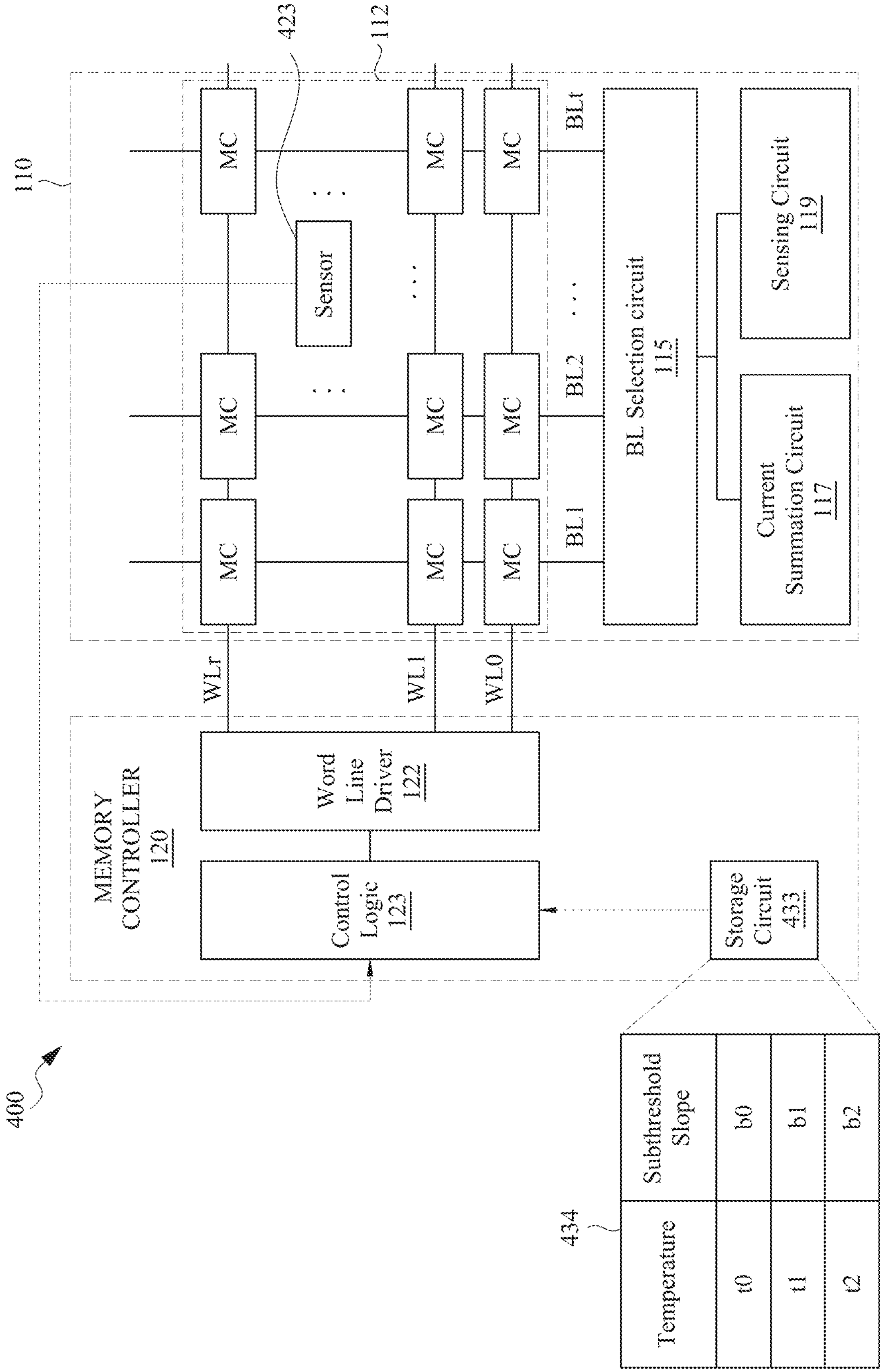
FIG. 4 is a schematic diagram of a memory device, in accordance with some embodiments.

FIG. 4 is a schematic diagram of a memory device 400, in accordance with some embodiments. Components in FIG. 4 having corresponding components in FIG. 1 are designated by the same reference numerals as in FIG. 1.

Compared with the memory device 100, the memory device 400 further comprises a temperature sensor 423 and a storage circuit 433. An example temperature sensor is a bandgap temperature sensor including bipolar junction transistors (BJTs), and further circuitry such as current sources, an operational amplifier, a voltage adder, and a control logic. An example BJT is described with respect to FIG. 6A. Other temperature sensor configurations are within the scopes of various embodiments. Examples of the storage circuit 433 include, but are not limited to, registers, memory cells, or other circuit elements configured for data storage. In some embodiments, the storage circuit 433 is omitted or incorporated in the control logic 123.

The temperature sensor 423 configured to detect a temperature of the memory device 400 in operation. In the example configuration in FIG. 4, the temperature sensor 423 is physically located in the memory array 112. A reason is that because the temperature sensor 423 is physically located close to the access transistors of memory cells configured to perform a DAC operation, it is possible for the temperature sensor 423 to accurately detect the operational temperature that affects the access transistors. In some embodiments, the memory device 400 comprises multiple temperature sensors 423 physically arranged at different locations in the memory device 400. Other locations and/or numbers of temperature sensors are within the scopes of various embodiments.

The temperature sensor 423 is coupled to the memory controller 120, e.g., to the control logic 123, to provide the detected temperature to the control logic 123 in operation of the memory device 400. The control logic 123 is configured to adjust one or more of the predetermined word line voltages (e.g., V0-V3) based on the temperature detected by the temperature sensor 423, and control the word line driver 122 to supply the adjusted word line voltages to the gates of the access transistors in a DAC operation. For example, it is possible in one or more embodiments that V0 (i.e., the lowest predetermined word line voltage) is not adjusted; however, the other word line voltages V1-V3 are adjusted based on the detected temperature. In a further example, all of the word line voltages V0-V3 are adjusted. In at least one embodiment where the same voltage difference b is between adjacent word line voltages among V0-V3, as described herein, the control logic 123 is configured to adjust one or more of the word line voltages V0-V3, by adjusting the voltage difference b based on the detected temperature. As described herein, the voltage difference b corresponds to the slope of the linear region 220 in the subthreshold region 210 of the current-voltage characteristic 200, and adjusting the voltage difference b corresponds to adjusting the slope of the linear region 220. In some embodiments, the control logic 123 is configured to perform the adjustment of one or more of the word line voltages V0-V3 and/or the voltage difference b so that the set of corresponding leakage currents I0-I3 remains unchanged, or substantially unchanged, as the operational temperature of the memory device 400 varies. In some embodiments, the leakage currents I0-I3 are considered substantially unchanged when any changes of one or more of the leakage currents I0-I3, due to the described temperature dependence and as a result of the described adjustment, are sufficiently small to not affect results of DAC operations.

In the example configuration in FIG. 4, the control logic 123 is configured to perform the described adjustment by referring to the storage circuit 433 which stores a predetermined relationship between different voltage data and corresponding different values of the operational temperature. In the example configuration in FIG. 4, the relationship is stored in the storage circuit 433 in the form of a look-up table 434. The look-up table 434 comprises various temperature values t0, t1, t2, or the like, of the operational temperature. For each temperature value t0, t1, t2, or the like, the look-up table 434 comprises corresponding voltage data usable by the control logic 123 to perform the described adjustment. In the example configuration in FIG. 4, the voltage data stored in the look-up table 434 comprise different values b0, b1, b2, or the like, of the voltage difference b. Upon receiving the detected temperature from the temperature sensor 423, the control logic 123 is configured to lookup the look-up table 434 to find a temperature value matching the detected temperature. For example, upon determining that the detected temperature being one of the temperature values, e.g., t0, the control logic 123 is configured to extract the corresponding voltage difference b0 from the look-up table 434, and use b0 to generate a corresponding set of word line voltages, e.g., with a fixed, predetermined V0, V1=V0+b0, V2=V1+b0, or the like. When an exact match of the detected temperature is not found in the look-up table 434, the control logic 123 is configured to determine the corresponding voltage difference by, e.g., interpolation or extrapolation. For example, when the detected temperature is between t0 and t1, the control logic 123 is configured to determine the corresponding voltage difference by interpolation, based on at least b0 and b1.

In some embodiments, the temperature values and corresponding voltage data in the look-up table 434 are determined in advance, e.g., by actual measurements of channel currents (or leakage currents) at different gate voltages and different operational temperatures for an actual transistor. In some embodiments, the temperature values and voltage data in the look-up table 434 are predetermined by a simulation executed by a computer system. In at least one embodiment, based on the actual measurements and/or simulation results, additional temperature values and corresponding voltage data are predetermined by interpolation, extrapolation, or the like. In some embodiments, the predetermined temperature values and corresponding voltage data of the look-up table 434 are hard-wired, e.g., by a circuit designer in the storage circuit 433. In at least one embodiment, at least a part, or a whole, of the temperature values and corresponding voltage data of the look-up table 434 is provided or updated from an device external, e.g., by an operator of the memory device 400 of a computer system including the memory device 400, through an I/O circuit of the memory device 400, to the storage circuit 433. The described process of predetermining a relationship between different voltage data and corresponding different temperature values is sometimes referred to as a temperature compensation process.

The described voltage data comprising different values of the voltage difference b constitute an example. Other voltage data are within the scopes of various embodiments. For example, in one or more embodiments, the voltage data include different sets of word line voltages V0-V3, or the like, each set corresponding to one of the temperature values t0, t1, t2, or the like. The described look-up table as a way to present the predetermined relationship between different voltage data and corresponding different temperature values is an example. Other manners for present the predetermined relationship are within the scopes of various embodiments. For example, in one or more embodiments, the relationship is expressed by at least one formula or function of the operational temperature. The formula or function is developed in advance based on actual measurements and/or simulation results as described herein, and is stored in the control logic 123. Upon receiving a detected temperature from the temperature sensor 423, the control logic 123 is configured to calculate a corresponding value of the voltage difference b or a corresponding set of word line voltages, e.g., V0-V3, by inputting the detected temperature into the stored formulas or functions. In some embodiments, by adjusting the word line voltages supplied to the access transistors in a DAC operation based on the operational temperature of the memory device, it is possible to ensure accuracy of the DAC operation. One or more advantages described herein are also achievable by the memory device 400, in accordance with some embodiments.

As described with respect to FIG. 3B, a read operation of a memory cell is potentially destructive to the datum stored in the capacitor of the memory cell, and periodical refreshing of memory cells is required in various situations in order to maintain the data stored therein. In other words, potential data disturb is a concern in memory devices. In some embodiments described, e.g., with respect to FIGS. 5A-5B, one or more memory devices are configured to perform DAC operations on data copied from a source of the data. As a result, it is possible in one or more embodiments to avoid data disturb at the source.

Figure 5B:
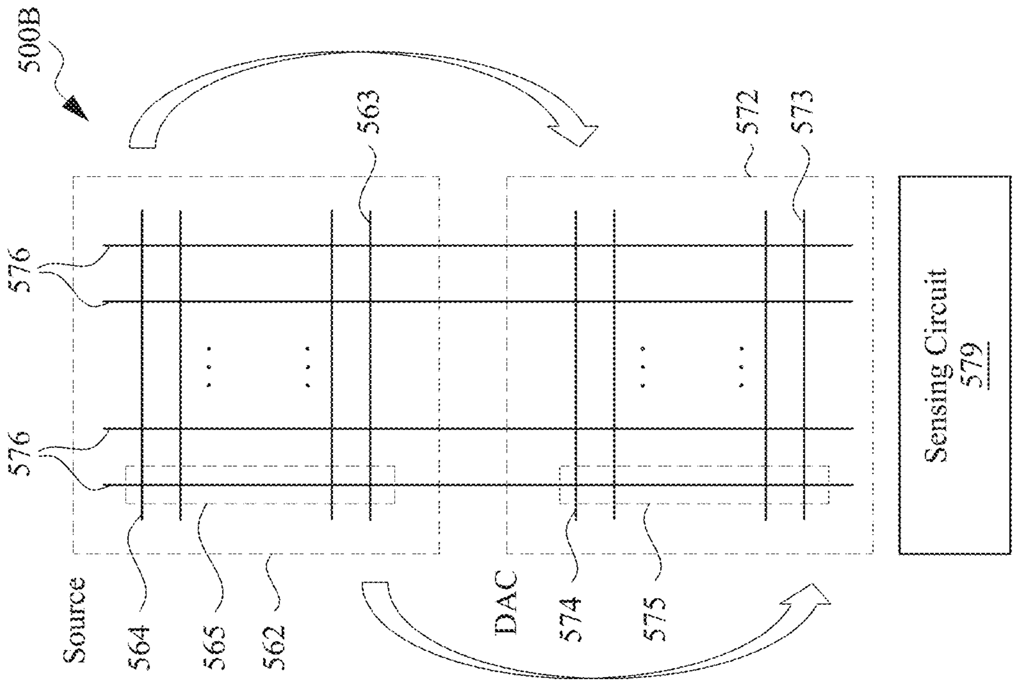
FIGS. 5A and 5B are schematic diagrams of memory devices, in accordance with some embodiments.
Figure 5A:
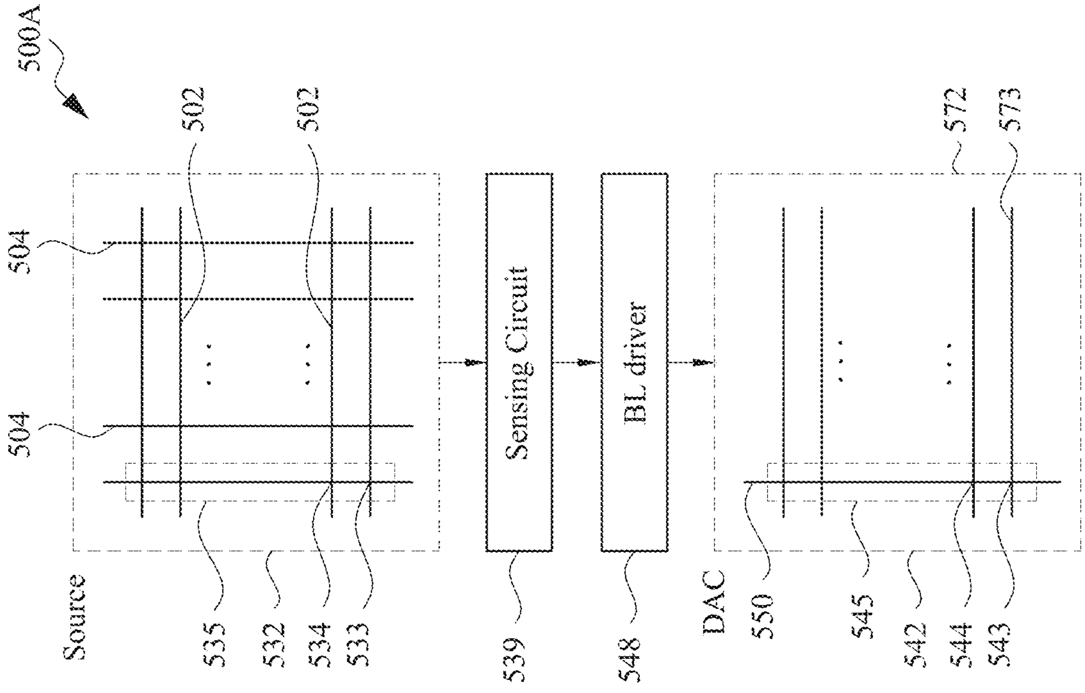

FIG. 5A is a schematic diagram of a memory device 500A, in accordance with some embodiments. In some embodiments, the memory device 500A corresponds to one or more of the memory devices 100, 300, 400.

The memory device 500A comprises a source memory array 532, and a DAC memory array 542. In some embodiments, the source memory array 532 and the DAC memory array 542 are regions of a larger memory array. In at least one embodiment, the source memory array 532 and the DAC memory array 542 are separate memory arrays, e.g., in different memory banks. In each of the memory arrays in FIG. 5A, the horizontal lines schematically represent word lines, the vertical lines schematically represent bit lines, and intersections of bit lines and word lines schematically represent memory cells. For example, in the source memory array 532, the word lines are designated with a label 502, the bit lines are designated with a label 504, and two example memory cells are designated with labels 533, 534. In the DAC memory array 542, the word lines and bit lines are not numbered, and two example memory cells are designated with labels 543, 544.

The source memory array 532 is configured to store digital source data 535 to be converted to analog signals. The source memory array 532 is configured with a sensing circuit 539, which is configured to perform read operations to read the source data 535 from the source memory array 532 in a manner similar to the read operation described with respect to FIG. 3B.

The DAC memory array 542 is configured to perform DAC operations. In at least one embodiment, the DAC memory array 542 corresponds to the memory array 112, and is configured with a BL selection circuit, a current summation circuit, and/or a sensing circuit corresponding to the BL selection circuit 115, current summation circuit 117, sensing circuit 119. The DAC memory array 542 is further configured with a bit line driver 548 which is configured to perform write operations to write data to be converted to the DAC memory array 542 in a manner similar to the write operation described with respect to FIG. 3B. In some embodiments, the bit line driver 548 is selectively coupled, e.g., under control of a control circuit of the memory device 500A, to the sensing circuit 539 through an internal bus of the memory device 500A. Other configurations are within the scopes of various embodiments.

In some embodiments, when the source data 535 are to be converted into analog signals, a DAC operation is not directly performed in the source memory array 532. Instead, the source data 535 are copied to the DAC memory array 542 before the DAC operation is performed at the DAC memory array 542, as described with respect to FIG. 3A. For example, a bit stored in the memory cell 533 is read out, in a read operation, by the sensing circuit 539 which transfers the read bit to the bit line driver 548. The bit line driver 548 then writes the bit, in a write operation, to a corresponding memory cell 543 in the DAC memory array 542. Similarly, remaining bits of the source data 535, e.g., in the memory cell 534, or the like, are copied to corresponding memory cells, e.g., the memory cell 544, or the like, in the DAC memory array 542. As a result, the DAC memory array 542 stores copied data 545 corresponding to the source data 535. A DAC operation is then performed on the copied data 545 by the DAC memory array 542, as described with respect to FIG. 3A.

In at least one embodiment, by performing DAC operations on copied data, rather than source data, it is possible to prevent the source data from being disturbed by the DAC operation.

In some situations, due to process variations, it is possible that the subthreshold slopes of access transistors in different regions of a memory device, or a memory array thereof, are different from one another. The potentially different subthreshold slopes in different regions complicate the calibration process of determining in advance the word line voltages to be used in DAC operations, because the different regions potentially require different sets of predetermined word line voltages. In some embodiments, by performing DAC operations in a specific region, e.g., the DAC memory array 542, it is sufficient to predetermine the word line voltages to be used in DAC operations for just the specific region, thereby simplifying the calibration process.

In some embodiments where an adjustment to compensate for temperature-dependent effects is to be made, the temperature compensation process of determining a relationship between different voltage data and corresponding different temperature values as described with respect to FIG. 4 is simplified when DAC operations are to be performed in a specific region of a memory array.

In some embodiments, the specific region where DAC operations are to be performed includes a single row or column of memory cells, e.g., the memory cells (including the memory cells 543, 544) coupled to a bit line 550 in the DAC memory array 542. In at least one embodiment, the specific region where DAC operations are to be performed includes a few rows or columns of memory cells, each row or column similar to the row or column corresponding to the bit line 550. In at least one embodiment, by configuring the specific region where DAC operations are to be performed as one or a few rows/columns, it is possible to further simplify the calibration process and/or the temperature compensation process.

FIG. 5B is a schematic diagram of a memory device 500B, in accordance with some embodiments. In some embodiments, the memory device 500B corresponds to one or more of the memory devices 100, 300, 400, 500A. Similar to FIG. 5A, in FIG. 5B, the horizontal lines schematically represent word lines, the vertical lines schematically represent bit lines, and intersections of bit lines and word lines schematically represent memory cells.

The memory device 500B comprises a source memory array 562, and a DAC memory array 572. The source memory array 562 and the DAC memory array 572 are regions of a larger memory array, and share a set of bit lines 576 and a sensing circuit 579. The source memory array 562 is configured to store digital source data 565 to be converted to analog signals, similarly to the source memory array 532. The DAC memory array 572 is configured to perform DAC operations, similarly to the DAC memory array 542. In some embodiments, when the source data 565 are to be converted into analog signals, a DAC operation is not directly performed in the source memory array 562. Instead, the source data 565 are first copied to the DAC memory array 572 where the DAC operation is to be performed later, as described with respect to FIG. 3A.

A manner of data copying (or data duplication) in the memory device 500B, in one or more embodiments, is different from that described with respect to the memory device 500A. Specifically, as described with respect to FIG. 3B, in a read operation, a sensing circuit, while amplifying and outputting read data, also restores or rewrites the read data back to the memory cells where the data were stored and read from. This rewriting process is used in one or more embodiments for copying from the source memory array 562 to the DAC memory array 572.

For example, as described with respect to FIG. 3B, in a read operation, the bit lines 576 are pre-charged and data in memory cells coupled to the word line 563 are read out by supplying an access voltage Va to the word line 563 in the source memory array 562. The read data (i.e., increasing or decreasing voltages on the bit lines 576) are detected or sensed by the sensing circuit 579. The sensing circuit 579 amplifies and rewrites the detected read data back to the memory cells coupled to the word line 563, by supplying VDD to one or more of the bit lines 576 where logic “1” was detected, and supplying VSS to one or more of the bit lines 576 where logic “0” was detected. During this rewriting process, a control circuit controls a word line driver of the memory device 500B to supply the access voltage Va to a corresponding word line 573 of the DAC memory array 572. Access transistors of memory cells coupled to the word line 573 are turned ON, and permit the voltages VDD or VSS on the bit lines 576 to write corresponding logic “1” or logic “0” to the memory cells coupled to the word line 573. As a result, data in the memory cells coupled to the word line 563 of the source memory array 562 are copied to corresponding memory cells coupled to the word line 573 of the DAC memory array 572, in single a read operation. Similarly and sequentially, data in memory cells coupled to each further word line of the source memory array 562 are copied to corresponding memory cells coupled to a corresponding word line of the DAC memory array 572. When data in memory cells coupled to the last word line 564 of the source memory array 562 are copied to corresponding memory cells coupled to a corresponding word line 574 of the DAC memory array 572, the data copying process is completed. The data in the source memory array 562, including the source data 565 to be converted to analog signals, are copied to the DAC memory array 572 which includes copied data 575 of the source data 565. A DAC operation is then performed on the copied data 575 by the DAC memory array 572, as described with respect to FIG. 3A.

In at least one embodiment, the memory device 500B permits a large amount of data to be quickly copied from a source memory array to a DAC memory array. This arrangement is advantageous in one or more embodiments where a large amount of data, e.g., in multiple rows or columns of memory cells, are to be converted to analog signals. One or more advantages described herein with respect to the memory device 500A are achievable by the memory device 500B, in accordance with some embodiments.

In some embodiments, both data copying configurations described with respect to the memory device 500A and memory device 500B are implementable in a single memory device. For example, the data copying configuration of the memory device 500A is performed when a source memory array and a DAC memory array do not share a common set of bit lines, and the data copying configuration of the memory device 500B is performed when a source memory array and a DAC memory array share a common set of bit lines.

Figure 6A:
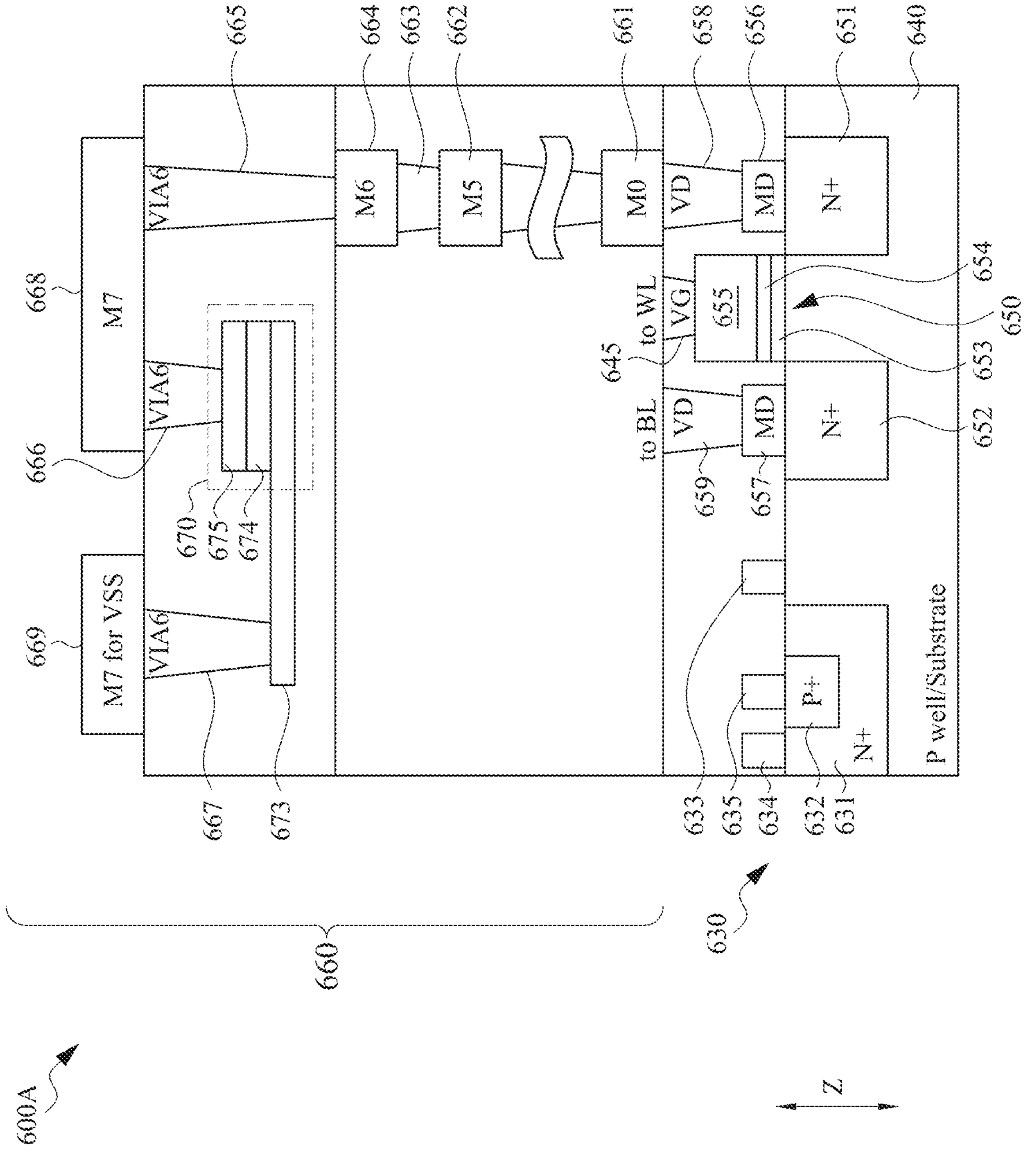
FIGS. 6A and 6B are schematic cross-sectional views of portions of memory devices, in accordance with some embodiments.

FIG. 6A is a schematic cross-sectional view of a portion of a memory device 600A, in accordance with some embodiments. In some embodiments, the memory device 600A corresponds to one or more of the memory devices 100, 300, 400, 500A, 500B.

The memory device 600A comprises a substrate 640, at least one transistor 650 over the substrate 640, an interconnect structure 660 over the transistor 650 and the substrate 640, and a metal-insulator-metal (MIM) structure 670 over the transistor 650 and the substrate 640. The MIM structure 670 comprises a capacitor coupled to the transistor 650 to form a memory cell having the 1T1C configuration as described herein. The transistor 650 is an example of an access transistor as described herein. The transistor 650 also serves as an example of transistors constituting various circuits in the memory device 600A including, but not limited to, BL selection circuits, current summation circuits, sensing circuits, a memory controller with components as described with respect to FIG. 1, storage circuits as described with respect to FIG. 4, Multiply-Accumulate circuits (MACs) as described with respect to FIG. 7A-7B, or the like.

In some embodiments, the substrate 640 is a semiconductor substrate. N-type and P-type dopants are added to the substrate to correspondingly form N wells 651, 652, and P wells (not shown). In some embodiments, isolation structures are formed between adjacent P wells and N wells. For simplicity, several features such as P wells and isolation structures are omitted from FIG. 6A.

The transistor 650 comprises a gate and source/drains. The N wells 651, 652 configure the source/drains of the transistor 650. The gate of the transistor 650 comprises a stack of gate dielectric layers 653, 654, and a gate electrode 655. In at least one embodiment, the transistor 650 comprises a gate dielectric layer instead of multiple gate dielectrics. Example materials of the gate dielectric layer or layers include HfO2, ZrO2, or the like. Example materials of the gate electrode 655 include polysilicon, metal, or the like.

The memory device 600A further comprises contact structures configured to electrically couple the transistor 650 to other circuitry in the memory device 600A. The contact structures comprise source/drain (metal-to-device, or MD) contacts 656, 657 correspondingly over and in electrical contact with the source/drains 651, 652. The contact structures further comprise various vias. For example, a via-to-gate (VG) via 645 is over and in electrical contact with the gate electrode 655, and is configured to couple the gate electrode 655 to a word line WL in the interconnect structure 660. Via-to-device (VD) vias 658, 659 are correspondingly over and in electrical contact with the MD contacts 656, 657. The VD via 658 is configured to couple the source/drain 651 to the capacitor in the MIM structure 670, as described herein. The VD via 659 is configured to couple the source/drain 652 to a bit line BL in the interconnect structure 660.

The interconnect structure 660 comprise a plurality of metal layers M0, M1, . . . and a plurality of via layers VIA0, VIA1, . . . arranged alternatingly in a thickness direction, i.e., a Z direction, of the substrate 640. The interconnect structure 660 further comprises various interlayer dielectric (ILD) layers (not shown) in which the metal layers and via layers are embedded. The M0 layer, i.e., metal-zero (M0) layer, is the lowermost metal layer immediately over and in electrical contact with the VD and VG vias, and is schematically illustrated in the drawings with the label “M0.” The M1 layer is the metal layer immediately over the M0 layer. The interconnect structure 660 further comprises other metal layers sequentially stacked over the M1 layer, and are schematically illustrated in the drawings with the corresponding labels such as “M5,” “M6,” and “M7.” The interconnect structure 660 also comprises via layers arranged between and electrically couple successive metal layers. A via layer VIAn is arranged between and electrically couple the Mn layer and the Mn+1 layer, where n is an integer from zero and up. For example, a via-zero (VIA0) layer is the lowermost via layer which is arranged between and electrically couple the M0 layer and the M1 layer. Several via layers are schematically illustrated in the drawings with corresponding labels such as “VIA5” and “VIA6.” The metal layers and via layers of the interconnect structure 660 are configured to electrically couple various elements or circuits of the memory device 600A with each other, and with external circuitry. Although the M7 layer is illustrated in FIG. 6A at a top level of the interconnect structure 660, the interconnect structure 660 comprises further metal layers and/or via layers higher than the M7 layer, in at least one embodiment.

In the example configuration in FIG. 6A, the interconnect structure 660 comprises the following structures sequentially stacked upward in the Z direction and electrically coupled to the VD via 658: an M0 pattern 661, various patterns and vias (not shown) in layers VIA0, M1, . . . VIA4, an M5 pattern 662, a VIA5 via 663, an M6 pattern 664, and a VIA6 via 665 in a VIA6 layer. The VIA6 layer further comprises VIA6 vias 666, 667. An overlying M7 layer comprises M7 patterns 668, 669 which are electrically isolated from each other. The M7 pattern 668 electrically couples the VIA6 via 665 and the VIA6 via 666. The M7 pattern 669 is coupled to the VIA6 via 667, and is configured as, or is coupled to, a power rail carrying VSS.

The MIM structure 670 is arranged over the M6 layer and comprises a multilayer structure. In the example configuration in FIG. 6A, the MIM structure 670 comprises the following layers sequentially stacked upward in the Z direction over the M6 layer: one or more passivation layers (not shown), a lower conductive layer (or electrode layer) 673, an insulating layer 674, an upper conductive layer 675, and one or more passivation layers (not shown). Example materials of the passivation layers include, but are not limited to, TEOS (tetraethyl orthosilicate), SBL (silicidation blocking layers), or the like. Example materials of the conductive layers 673, 675 include, but are not limited to, TiN, TaN, or the like. Example materials of the insulating layer 674 include, but are not limited to, silicon dioxide, ZrO, TiO2, HfOx, a high-k dielectric, or the like. Examples of high-k dielectrics include, but are not limited to, zirconium dioxide, hafnium dioxide, zirconium silicate, hafnium silicate, or the like. The lower conductive layer 673 is coupled by the VIA6 via 667 to the M7 pattern 669 for VSS. The insulating layer 674, the upper conductive layer 675 and one or more of the passivation layers are patterned to be present under the VIA6 via 666, but not under the VIA6 via 667. The VIA6 via 666 extends through the one or more passivation layers to electrically couple the upper conductive layer 675 to the M7 pattern 668, and therefore, to the source/drain 651 of the transistor 650 through various patterns and vias in various metal layers and via layers as described herein. The lower conductive layer 673, insulating layer 674, and upper conductive layer 675 under the VIA6 via 666 together configure a capacitor which is serially coupled with the transistor 650 between a bit line BL and VSS to configure a memory cell. The capacitor in the MIM structure 670 and the transistor 650 at least partially overlap each other in the Z direction, as schematically illustrated in FIG. 6A.

In the example configuration in FIG. 6A, the MIM structure 670 is arranged between the M6 layer and the M7 layer. However, other arrangements in which the MIM structure 670 is arranged between any two metal layers of the interconnect structure 660 are within the scopes of various embodiments. In some embodiments, the pattern 668 coupled to the transistor 650 and the pattern 669 for VSS are arranged in different metal layers.

The described configuration of the transistor 650 is an example. Various transistor configurations are within the scopes of various embodiments, including, but not limited to, metal oxide semiconductor field effect transistors (MOSFET), complementary metal oxide semiconductors (CMOS) transistors, P-channel metal-oxide semiconductors (PMOS), N-channel metal-oxide semiconductors (NMOS), bipolar junction transistors (BJT), high voltage transistors, high frequency transistors, P-channel and/or N-channel field effect transistors (PFETs/NFETs), FinFETs, planar MOS transistors with raised source/drains, nanosheet FETs, nanowire FETs, or the like. The described capacitor configuration as a MIM structure is an example. Other capacitor configurations, such as MOS capacitor, trench capacitor, or the like, are within the scopes of various embodiments.

In the example configuration in FIG. 6A, the memory device 600A further comprises a bipolar junction transistors (BJT) 630 configured as at least a part of a bandgap temperature sensor corresponding to the temperature sensor 423. In some embodiments where a temperature sensor is not required, the BJT 630 is omitted. In the example configuration in FIG. 6A, the BJT 630 is a PNP BJT. In some embodiments, the BJT 630 is an NPN BJT. The BJT 630 comprises a P well (not shown), an N well 631 inside the P well, a P-doped region 632 inside the N well 631, and contact structures 633-635 correspondingly over and in electrical contact with the P well, N well 631, P-doped region 632. In some embodiments, the N well 631 corresponds to, or is similar to, the N wells 651, 652, and the contact structures 633-635 correspond to, or are similar to, MD contacts 656, 657. The memory device 600A further comprises various vias corresponding to, or similar to, the VD vias 658, 659, for coupling the BJT 630 to other circuit elements of the bandgap temperature sensor. In at least one embodiment, by arranging the BJT 630 on the same substrate 640 as, and/or close to, the access transistors of one or more memory cells, operational temperature variations that potentially affect the access transistors are reflected in one or more temperature-dependent properties of the BJT 630, which permit the other circuit elements of the bandgap temperature sensor to accurately detect the operational temperature to be used for a temperature-dependent adjustment, as described herein. In at least one embodiment, one or more advantages described herein are achievable in the memory device 600A, in accordance with some embodiments.

A structure below the M0 layer and including the transistor 650 is manufactured by front-end-of-line (FEOL) processing, and is sometimes referred to as an FEOL structure. For example, the transistor 650 is an FEOL transistor. A structure including the M0 layer and above is manufactured by back-end-of-line (BEOL) processing, and is sometimes referred to as a BEOL structure. For example, the MIM structure 670 is a BEOL capacitor.

In the memory device 600A, access transistors of memory cells are FEOL transistors which occupy a chip area on the substrate 640 which could otherwise be configured to form other circuitry. In some embodiments, access transistors of memory cells are BEOL transistors which do not occupy chip areas on the substrate 640, thereby freeing up chip areas on the substrate 640 for other circuitry, as described with respect to FIG. 6B.

Figure 6B:
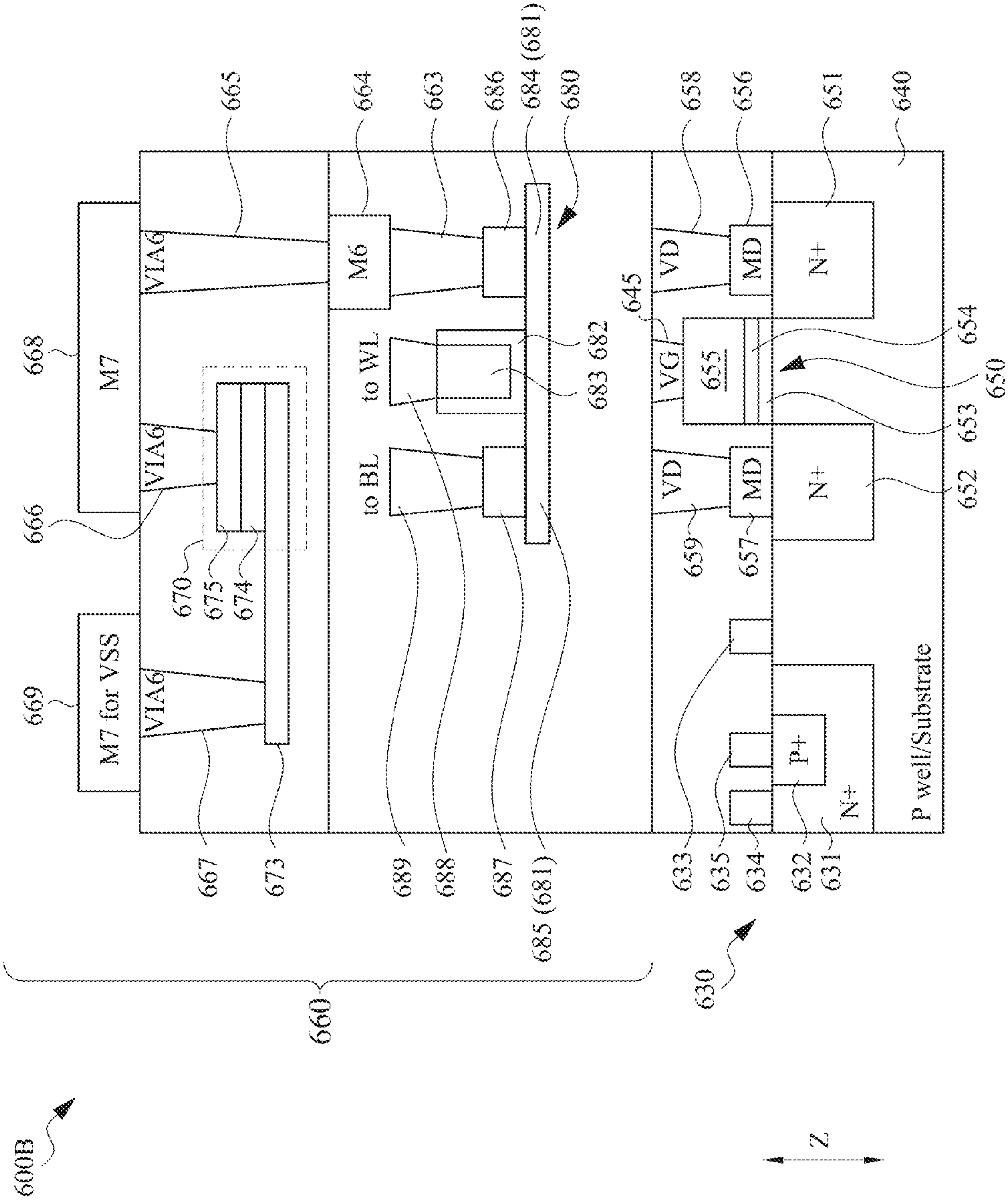

FIG. 6B is a schematic cross-sectional view of a portion of a memory device 600B, in accordance with some embodiments. In some embodiments, the memory device 600B corresponds to one or more of the memory devices 100, 300, 400, 500A, 500B. Components in FIG. 6B having corresponding components in FIG. 6A are designated by the same reference numerals as in FIG. 6A.

Compared to the memory device 600A, the memory device 600B comprises BEOL transistors each coupled to a BEOL capacitor to form a BEOL memory cell. For example, a transistor 680 in the memory device 600B is a BEOL transistor that is coupled to the BEOL capacitor in the MIM structure 670 to form a BEOL memory cell. In the example configuration in FIG. 6B, the transistor 650 is an example of FEOL transistors constituting various circuits other than memory cells in the memory device 600B.

The transistor 680 comprises a metal oxide layer 681, a gate dielectric layer 682 lining an opening formed in a dielectric layer over the metal oxide layer 681, and a gate electrode 683 filled in a remainder of the opening. A portion of the metal oxide layer 681 under the gate electrode 683 defines a channel of the transistor 680. Portions of the metal oxide layer 681 on opposite sides of the channel define source/drains 684, 685. Contact structures 686, 687 are correspondingly over and in electrical contact with the source/drains 684, 685. Vias 663, 688, 689 are correspondingly over and in electrical contact with the contact structure 686, gate electrode 683, contact structure 687. The via 663 is configured to couple the source/drain 684 to the capacitor in the MIM structure 670, as described with respect to FIG. 6A. The via 688 is configured to couple the gate electrode 683 to a word line WL in the interconnect structure 660. The via 689 is configured to couple the source/drain 685 to a bit line BL in the interconnect structure 660. In some embodiments, the metal oxide layer 681 comprises InGaZnO4 (IGZO), the gate dielectric layer 682 comprise SiO2, and the gate electrode 683 and the contact structures 686, 687 comprise TiN. Other materials are within the scopes of various embodiments.

In the example configuration in FIG. 6B, the transistor 680 is arranged below the M6 layer and the MIM structure 670. However, other arrangements in which the transistor 680 is arranged at another layer or level in the interconnect structure 660, and/or above the MIM structure 670 are within the scopes of various embodiments. Although the BJT 630 is an FEOL device and the transistor 680, i.e., an access transistor, is a BEOL device at a different level, in one or more embodiments, an operational temperature detected by using the BJT 630 is still sufficiently accurate for an intended temperature-dependent adjustment, as described herein. In some embodiments, the BJT 630 is replaced with a BEOL BJT, or a BEOL P-N junction, arranged closer to the transistor 680 for more accurate temperature detections. In some embodiments, where a temperature sensor is not required, the BJT 630 is omitted from the memory device 600B.

As described herein, the memory device 600B with BEOL access transistors, i.e., BEOL memory cells and BEOL memory arrays, makes it possible to free-up additional chip area for other circuitry. In at least one embodiment, one or more advantages described herein are achievable in the memory device 600B, in accordance with some embodiments.

Figure 7B:
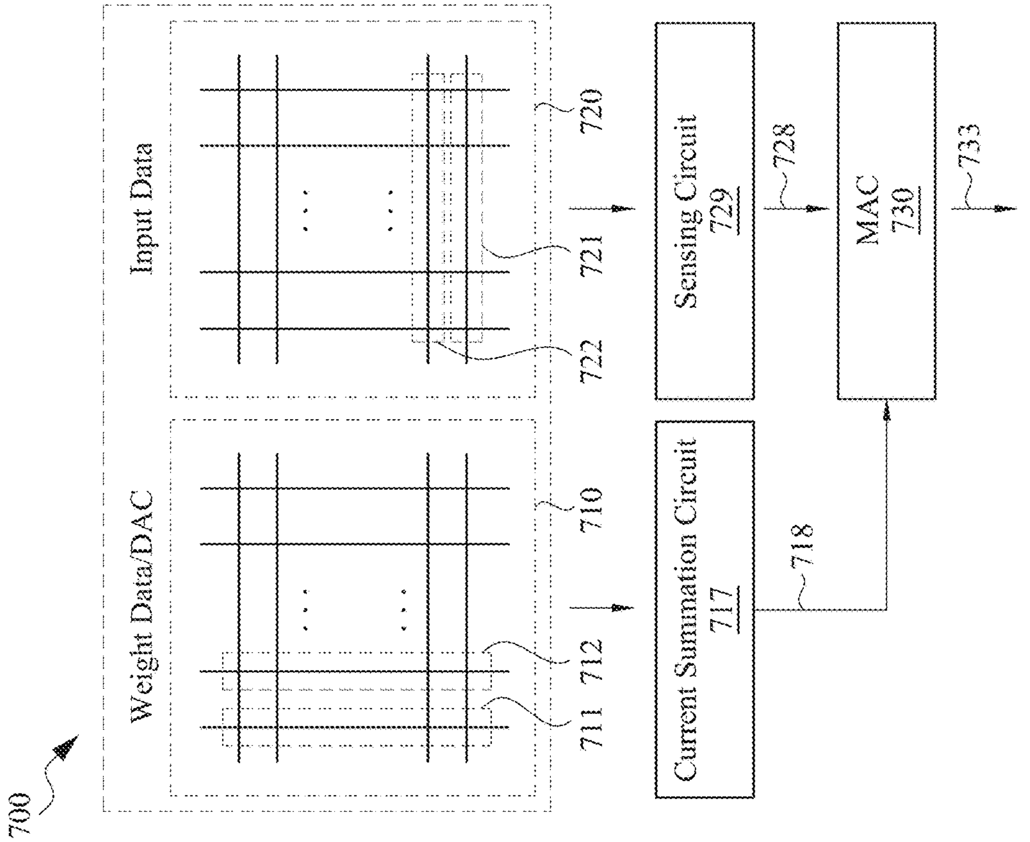
FIGS. 7A and 7B are schematic diagrams of a memory device in various operations, in accordance with some embodiments.
Figure 7A:
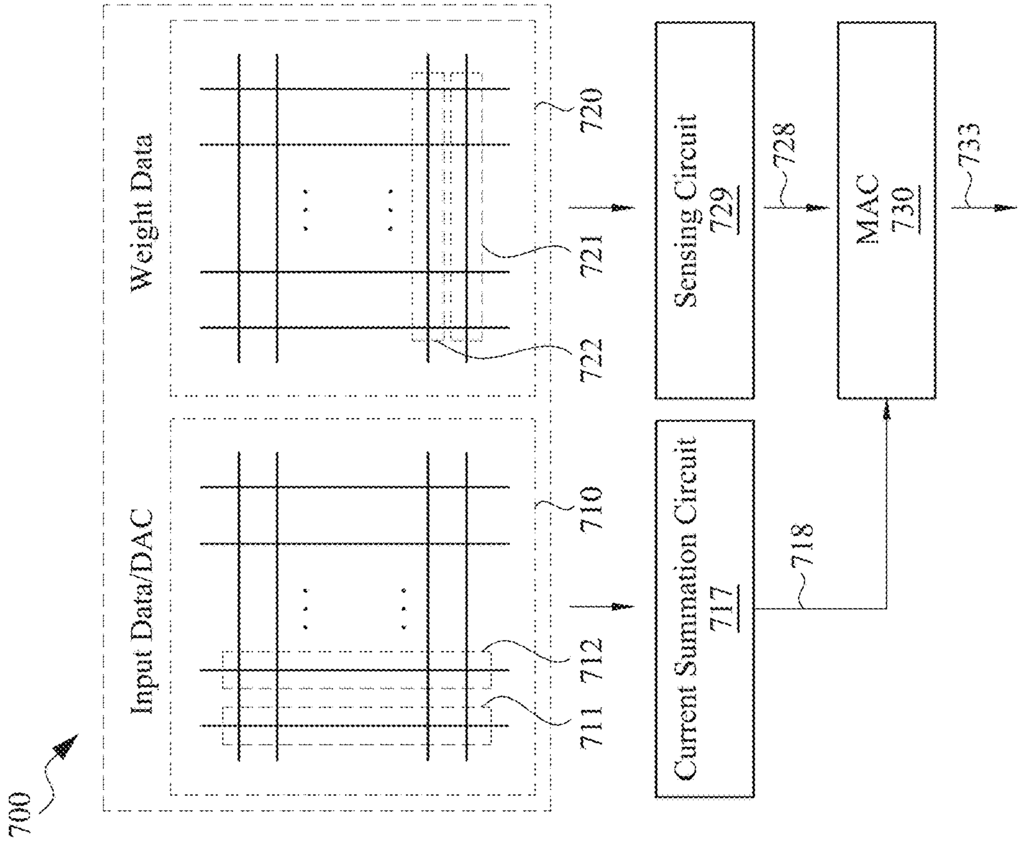

FIGS. 7A and 7B are schematic diagrams of a memory device 700 in various operations, in accordance with some embodiments. In some embodiments, the memory device 700 corresponds to one or more of the memory devices 100, 300, 400, 500A, 500B, 600A, 600B.

The memory device 700 comprises a DAC memory array 710, a memory array 720, and a Multiply-Accumulate circuit (MAC) 730. In some embodiments, the DAC memory array 710 and memory array 720 are regions of a larger memory array. In at least one embodiment, DAC memory array 710 and memory array 720 are separate memory arrays, e.g., in different memory banks. In each of the memory arrays in FIGS. 7A-7B, the horizontal lines schematically represent word lines, the vertical lines schematically represent bit lines, and intersections of bit lines and word lines schematically represent memory cells.

The DAC memory array 710 is configured to perform DAC operations on first digital data stored therein. The DAC memory array 710 is configured with a current summation circuit 717 which outputs analog signals 718 corresponding to the first digital data to the MAC 730. In some embodiments, the DAC memory array 710 and current summation circuit 717 correspond to the memory array 112 and current summation circuit 117, and are configured to perform DAC operations as described with respect to FIG. 3A.

The memory array 720 is configured to store second digital data to be operated on, together with the first digital data, in a CIM operation. The memory array 720 is configured with a sensing circuit 729 which reads the second digital data from the memory array 720 and outputs the read second digital data 728 to the MAC 730. In some embodiments, the DAC memory array 720 and sensing circuit 729 are configured to perform read operations as described with respect to FIG. 3B.

The MAC 730 is an example of a computation circuit configured to perform a CIM operation on the first digital data having been converted to analog signals 718 and the read second digital data 728, and to output a result of the CIM operation as output 733. Examples of CIM operations include, but are not limited to, mathematical operations, logical operations, combination thereof, or the like. In some embodiments, the MAC 730 is configured to multiply each of the analog signals 718 with a corresponding row of the read second digital data 728, and perform accumulation or summation of the multiplication results to obtain the output 733. For example, the MAC 730 is configured to multiply, among the analog signals 718, an analog signal corresponding to data in a column 711 of the DAC memory array 710 with data in a row 721 of the memory array 720. The MAC 730 is next configured to multiply, among the analog signals 718, an analog signal corresponding to data in a column 712 of the DAC memory array 710 with data in a row 722 of the memory array 720. The described multiplication is similarly repeated for remaining columns of the DAC memory array 710 and remaining corresponding rows of the memory array 720. The MAC 730 is further configured to perform accumulation or summation of the multiplication results, to obtain the output 733.

In at least one embodiment, the output 733 comprises one or more analog signals. In at least one embodiment, the analog signals in the output 733 are directly supplied to a further MAC for a further CIM operation. In some embodiments, the memory device 700 further comprises one or more analog-to-digital converters (ADCs) configured to convert the analog signals in the output 733 to digital data for output or for further processing, such as another CIM operation, or the like. Example ADCs include, but are not limited to, logics, integrated circuits, comparators, counters, registers, combinations thereof, or the like. In some embodiments, the MAC 730 comprises one or more of accumulators, multipliers, adders, or the like. Example accumulators include, but are not limited to, resistors, capacitors, integrator circuits, operational amplifiers, combinations thereof, or the like. Example multipliers include, but are not limited to, NOR gates, AND gates, any other logic gates, combinations of logic gates, or the like. Example adders include, but are not limited to, full adders, half adders, or the like. In some embodiments, the adders are coupled to each other to form an adder tree having multiple stages. Other MAC configurations are within the scopes of various embodiments.

In some embodiments, one of the first and second digital data comprise weight data, and the other of the first and second digital data comprise input data. For example, in FIG. 7A, the first digital data stored in the DAC memory array 710 to be converted to analog signals comprise input data, whereas the second digital data stored in the memory array 720 comprise weight data. In FIG. 7B, the first digital data stored in the DAC memory array 710 to be converted to analog signals comprise weight data, whereas the second digital data stored in the memory array 720 comprise input data. FIGS. 7A-7B serve as examples that it is possible to convert either weight data or input data to analog signals by DAC operations in accordance with some embodiments. Further examples of weight data and input data are described with respect to FIGS. 8A-8B. In some embodiments, at least one of the first digital data or the second digital data comprise data other than weight data and input data. One or more advantages described herein are achievable by the memory device 700, in accordance with some embodiments.

Figure 8A:
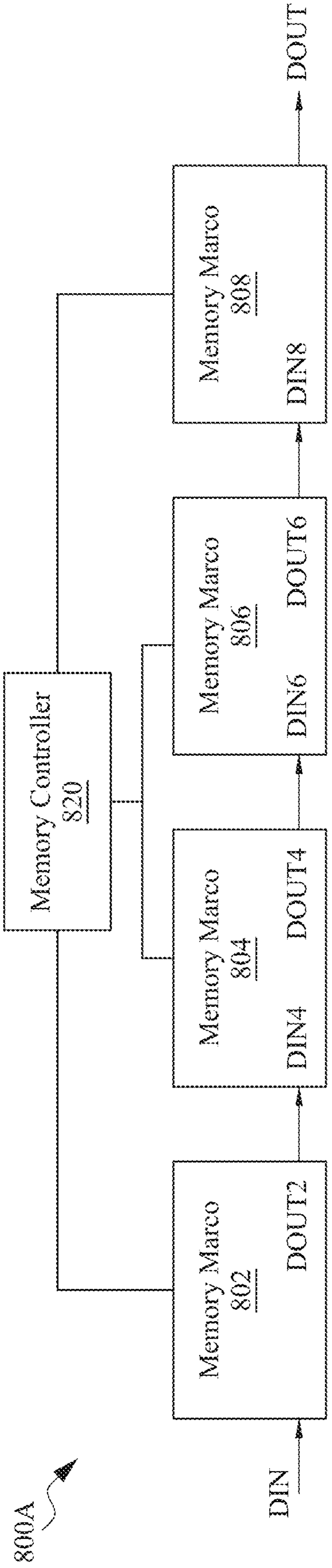
FIG. 8A is a schematic diagram of a memory device, in accordance with some embodiments.

FIG. 8A is a schematic diagram of a memory device 800A, in accordance with some embodiments.

The memory device 800A comprises memory macros 802, 804, 806, 808 and memory controller 820. In some embodiments, one or more of the memory macros 802, 804, 806, 808 correspond to the memory macro 110, and/or the memory controller 820 corresponds to the memory controller 120. In the example configuration in FIG. 8A, the memory controller 820 is a common memory controller for the memory macros 802, 804, 806, 808. In at least one embodiment, at least one of the memory macros 802, 804, 806, 808 has its own memory controller. The number of four memory macros in the memory device 800A is an example. Other configurations are within the scopes of various embodiments.

The memory macros 802, 804, 806, 808 are coupled to each other in sequence, with output data of a preceding memory macro being input data for a subsequent memory macro. For example, input data DIN are input into the memory macro 802. The memory macro 802 performs one or more CIM operations based on the input data DIN and weight data stored in the memory macro 802, and generates output data DOUT2 as results of the CIM operations. The output data DOUT2 are supplied as input data DIN4 of the memory macro 804. The memory macro 804 performs one or more CIM operations based on the input data DIN4 and weight data stored in the memory macro 804, and generates output data DOUT4 as results of the CIM operations. The output data DOUT4 are supplied as input data DIN6 of the memory macro 806. The memory macro 806 performs one or more CIM operations based on the input data DIN6 and weight data stored in the memory macro 806, and generates output data DOUT6 as results of the CIM operations. The output data DOUT6 are supplied as input data DIN8 of the memory macro 808. The memory macro 808 performs one or more CIM operations based on the input data DIN8 and weight data stored in the memory macro 808, and generates output data DOUT as results of the CIM operations. One or more of the input data DIN, DIN4, DIN6, DIN8 correspond to the input data described with respect to FIGS. 7A-7B, and/or one or more of the output data DOUT2, DOUT4, DOUT6, DOUT correspond to the output data described with respect to FIGS. 7A-7B. In at least one embodiment, the described configuration of the memory macros 802, 804, 806, 808 implements a neural network. In at least one embodiment, one or more advantages described herein are achievable by the memory device 800A.

Figure 8B:
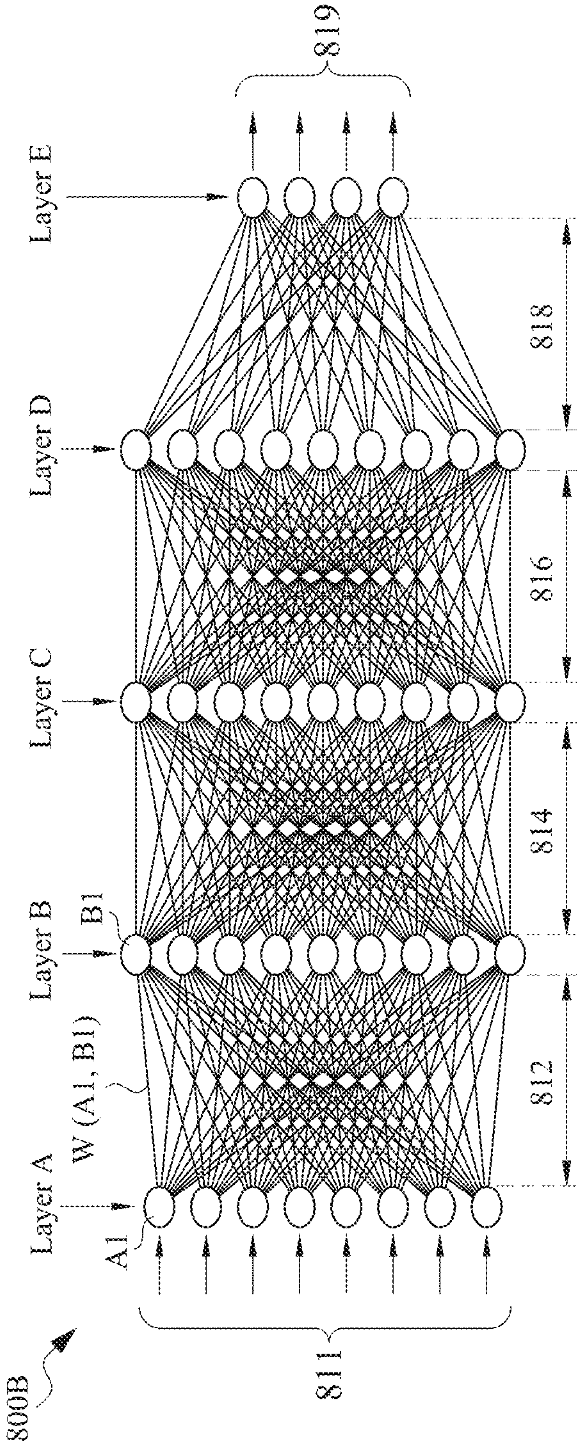
FIG. 8B is a schematic diagram of a neural network, in accordance with some embodiments.

FIG. 8B is a schematic diagram of a neural network 800B, in accordance with some embodiments.

The neural network 800B comprises a plurality of layers A-E each comprising a plurality of nodes (or neurons). The nodes in successive layers of the neural network 800B are connected with each other by a matrix or array of connections. For example, the nodes in layers A and B are connected with each other by connections in a matrix 812, the nodes in layers B and C are connected with each other by connections in a matrix 814, the nodes in layers C and D are connected with each other by connections in a matrix 816, and the nodes in layers D and E are connected with each other by connections in a matrix 818. Layer A is an input layer configured to receive input data 811. The input data 811 propagate through the neural network 800B, from one layer to the next layer via the corresponding matrix of connections between the layers. As the data propagate through the neural network 800B, the data undergo one or more computations, and are output as output data 819 from layer E which is an output layer of the neural network 800B. Layers B, C, D between input layer A and output layer E are sometimes referred to as hidden or intermediate layers. The number of layers, number of matrices of connections, and number of nodes in each layer in FIG. 8B are examples. Other configurations are within the scopes of various embodiments. For example, in at least one embodiment, the neural network 800B includes no hidden layer, and has an input layer connected by one matrix of connections to an output layer. In one or more embodiments, the neural network 800B has one, two, or more than three hidden layers.

In some embodiments, the matrices 812, 814, 816, 818 are correspondingly implemented by the memory macros 802, 804, 806, 808, the input data 811 correspond to the input data DIN, and the output data 819 correspond to the output data DOUT. Specifically, in the matrix 812, a connection between a node in layer A and another node in layer B has a corresponding weight. For example, a connection between node A1 and node B1 has a weight W(A1,B1) which corresponds to a weight value stored, e.g., in a row or a column of a memory array of the memory macro 802. The memory macros 804, 806, 808 are configured in a similar manner. The weight data in one or more of the memory macros 802, 804, 806, 808 are updated, e.g., by a processor and through the memory controller 820, as machine learning is performed using the neural network 800B. One or more advantages described herein are achievable in the neural network 800B implemented in whole or in part by one or more memory macros and/or memory devices in accordance with some embodiments.

Figure 8C:
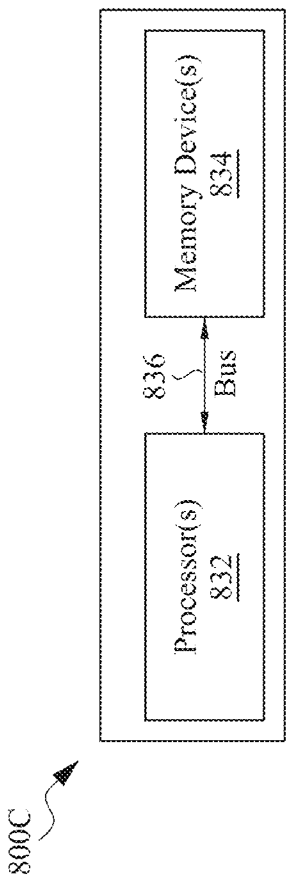
FIG. 8C is a schematic diagram of an integrated circuit (IC) device, in accordance with some embodiments.

FIG. 8C is a schematic diagram of an integrated circuit (IC) device 800C, in accordance with some embodiments.

The IC device 800C comprises one or more hardware processors 832, one or more memory devices 834 coupled to the processors 832 by one or more buses 836. In some embodiments, the IC device 800C comprises one or more further circuits including, but not limited to, cellular transceiver, global positioning system (GPS) receiver, network interface circuitry for one or more of Wi-Fi, USB, Bluetooth, or the like. Examples of the processors 832 include, but are not limited to, a central processing unit (CPU), a multi-core CPU, a neural processing unit (NPU), a graphics processing unit (GPU), a digital signal processor (DSP), a field-programmable gate array (FPGA), an application-specific integrated circuit (ASIC), other programmable logic devices, a multimedia processor, an image signal processors (ISP), or the like. Examples of the memory devices 834 include one or more memory devices and/or memory macros described herein. In at least one embodiment, each of the processors 832 is coupled to a corresponding memory device among the memory devices 834.

In some embodiments, the memory devices 834 are CIM memory devices, and various computations are performed in the memory devices which reduces the computing workload of the corresponding processor 832, reduces memory access time, and improves performance. In at least one embodiment, the IC device 800C is a system-on-a-chip (SOC). In at least one embodiment, one or more advantages described herein are achievable by the IC device 800C.

Figure 8D:
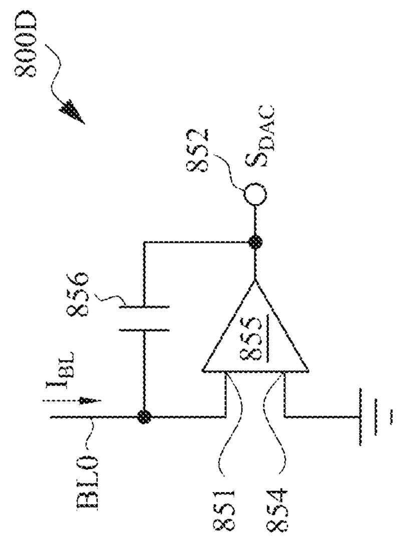
FIG. 8D is a circuit diagram of an integrator circuit, in accordance with some embodiments.

FIG. 8D is a circuit diagram of an integrator circuit 800D, in accordance with some embodiments. In some embodiments, the integrator circuit 800D is an example of one or more of the current summation circuits 117, 317, 717. For example, the integrator circuit 800D is described herein as being applied to the current summation circuit 317 in FIG. 3A.

The integrator circuit 800D comprises an operational amplifier 855 and a capacitor 856. An input 851 of the operational amplifier 855 is electrically coupled, through a BL selection circuit (not shown), to a bit line BL0 to receive the bit line current $I_{BL}$, as described herein. A further input 854 of the operational amplifier 855 is grounded. The capacitor 856 is electrically coupled between the input 851 and an output 852 of the operational amplifier 855. The operational amplifier 855 and the capacitor 856 are configured to integrate the bit line current $I_{BL}$ over time to generate the analog signal $S_{DAC}$. The described configuration of the integrator circuit 800D is an example. Other integrator circuit configurations or current summation circuit configurations are within the scopes of various embodiments.

Figure 9:
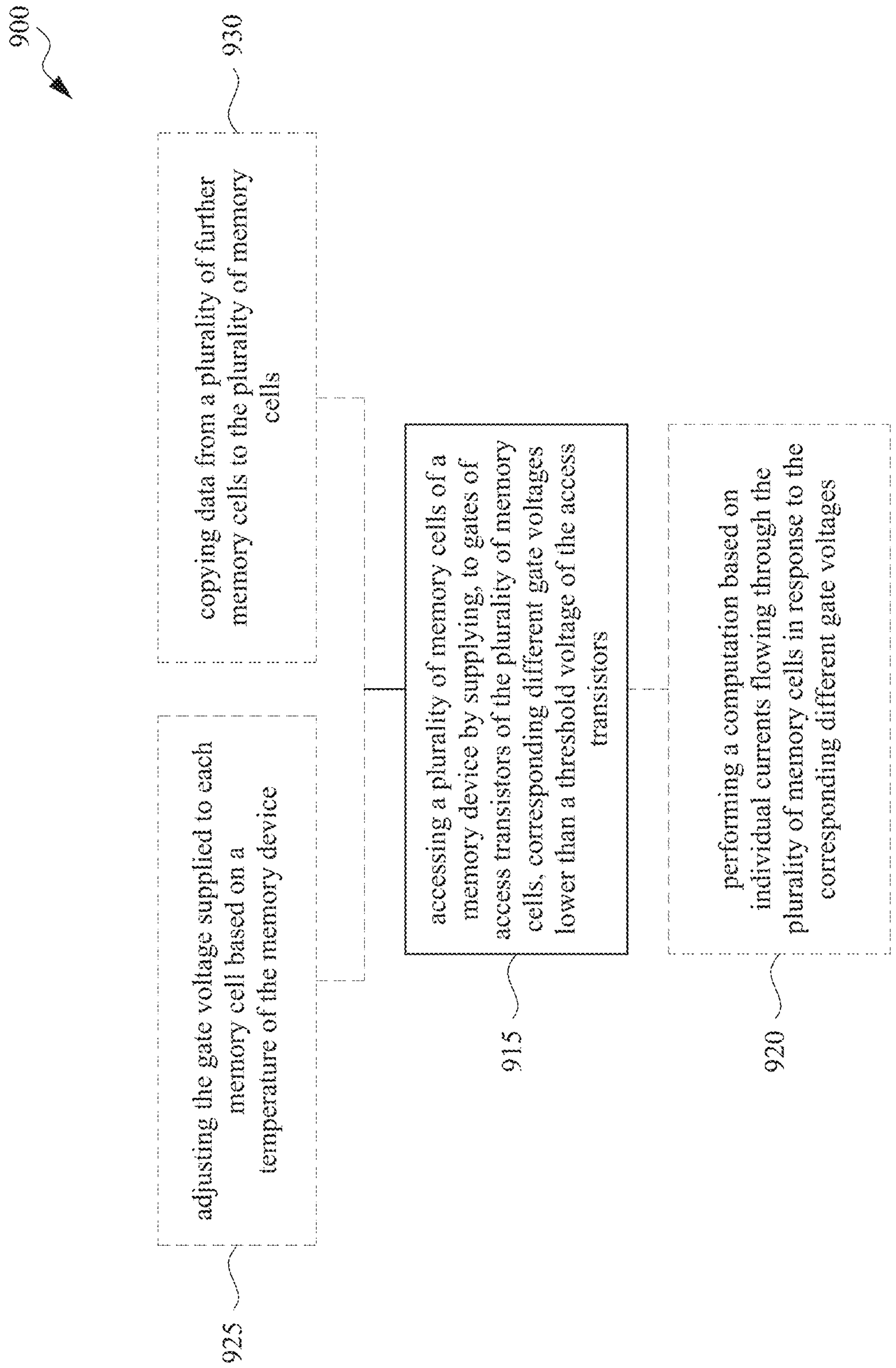
FIG. 9 is a flowchart of a method, in accordance with some embodiments.

FIG. 9 is a flowchart of a method 900 of operating a memory device, in accordance with some embodiments. In at least one embodiment, the method 900 is performed in or by one or more of the memory devices or memory macros described herein. In the example configuration in FIG. 9, the method 900 comprises operations 915, 920, 925, 930. In some embodiments, one or more of operations 920, 925, 930 is/are omitted.

At operation 915, a plurality of memory cells of a memory device is accessed, by supplying, to gates of access transistors of the plurality of memory cells, corresponding different gate voltages lower than a threshold voltage of the access transistors. In some embodiments, the different gate voltages are in a linear region of a current-voltage characteristic, to permit an individual current to flow through the each memory cell. The individual current corresponds to a datum stored in the each memory cell and the corresponding gate voltage. For example, as described with respect to FIG. 3A, in a DAC operation in accordance with some embodiments, a plurality of memory cells MC0-MC3 of a memory device 300 is accessed, by supplying, to gates of access transistors T0-T3 of the memory cells MC0-MC3, corresponding different gate voltages V0-V3. The gate voltages V0-V3, as described with respect to the example configuration in FIG. 2, are in a linear region 220 of a current-voltage characteristic 200 between a channel current Ids in logarithmic scale and a gate voltage Vds of the access transistors T0-T3.

At operation 920, a computation is performed based on individual currents flowing through the plurality of memory cells in response to the corresponding different gate voltages. For example, as described with respect to FIG. 3A, in response to the gate voltage, e.g., V0, supplied to the gate of the access transistor, e.g., T0, of each memory cell, e.g., MC0, an individual current, e.g., I0×Bit0, corresponding to a datum Bit0 stored in the memory cell MC0 and gate voltage V0, is permitted to flow through the memory cell MC0. The individual currents permitted to flow through the corresponding memory cells correspond to an analog signal being a result of a digital-to-analog conversion of the data stored in the memory cells. In one or more embodiments, the individual currents are collected on a bit line, and a summation of the individual currents is performed by a current summation circuit 317 to obtain the analog signal $S_{DAC}$ corresponding to the data stored in the memory cells MC0-MC3. As described with respect to FIGS. 7A-7B, a computation is performed, e.g., by a MAC 730, based on analog signals, e.g., 718, and further data, e.g., 728, to generate an output, e.g., 733. The described computation is an example of a CIM operation. In some embodiments, operation 920 is omitted, e.g., where an analog signal being a result of a digital-to-analog conversion is used by, or subjected to, processing other than CIM operations.

At operation 925, prior to operation 915, the gate voltage to be supplied to each memory cell is adjusted based on a temperature of the memory device. For example, as described with respect to FIG. 4, in one or more embodiments, a temperature sensor 423 detects an operational temperature of the memory device, and supplies the detected operational temperature to a control logic 123. The control logic 123 adjusts one or more of the gate voltages V0-V3 based on the detected operational temperature. In an example temperature-dependent adjustment, the control logic 123 refers to a predetermined relationship between different voltage data, e.g., b0, b1, b2, and corresponding different values, e.g., t0, t1, t2, of the operational temperature, extracts the voltage data, e.g., one of b0, b1, b2, corresponding to the detected operational temperature, and adjusts one or more of the gate voltages V0-V3 based on the extracted voltage data. The adjusted gate voltages are then supplied to the gates of the access transistors in operation 915. In some embodiments, operation 925 is omitted, e.g., where a temperature-dependent adjustment is not required.

At operation 930, prior to operation 915, data to be converted to one or more analog signals are copied from a plurality of further memory cells to the plurality of memory cells where a DAC operation is to be performed. For example, as described with respect to FIGS. 5A-5B, in one or more embodiments, source data 535, 565 to be converted are copied from memory cells in a source memory array 532, 562 to corresponding memory cells in a DAC memory array 542, 572. A DAC operation is then performed on the copied data, e.g., 545, 575, as described with respect to operation 915. In some embodiments, operation 930 is omitted, e.g., where the data to be converted are already in a DAC memory array. One or more advantages described herein are achievable by the method 900, in accordance with some embodiments.

The described methods and algorithms include example operations, but they are not necessarily required to be performed in the order shown. Operations may be added, replaced, changed order, and/or eliminated as appropriate, in accordance with the spirit and scope of embodiments of the disclosure. Embodiments that combine different features and/or different embodiments are within the scope of the disclosure and will be apparent to those of ordinary skill in the art after reviewing this disclosure.

In some embodiments, a memory device comprises a plurality of word lines, a bit line, a memory array, a control circuit, and a current summation circuit. The memory array comprises a plurality of memory cells coupled to the bit line. Each of the plurality of memory cells comprises an access transistor coupled to a corresponding word line among the plurality of word lines. The control circuit is configured to supply, correspondingly through the plurality of word lines, a plurality of word line voltages, different from each other, to the access transistors. The current summation circuit is configured to be coupled to the bit line, and to detect a bit line current on the bit line.

In some embodiments, a memory device comprises a plurality of word lines, a bit line, a memory array, and a control circuit. The memory array comprises a plurality of memory cells coupled to the bit line. Each of the plurality of memory cells comprises an access transistor coupled to a corresponding word line among the plurality of word lines. The control circuit is configured to, in a digital-to-analog conversion (DAC) operation, supply a plurality of word line voltages correspondingly through the plurality of word lines to the access transistors of the plurality of memory cells, the plurality of word line voltages lower than a threshold voltage of the access transistors. The control circuit is further configured to, in a read operation of a selected memory cell among the plurality of memory cells, supply a read voltage through the corresponding word line to the access transistor of the selected memory cell, the read voltage equal to or higher than the threshold voltage.

In some embodiments, a method comprises a computing-in-memory (CIM) operation of a memory device. The CIM operation comprises accessing a plurality of memory cells of the memory device by supplying, to gates of access transistors of the plurality of memory cells, corresponding different gate voltages lower than a threshold voltage of the access transistors. The CIM operation further comprises performing a computation based on individual currents flowing through the plurality of memory cells in response to the corresponding different gate voltages.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
- a plurality of word lines;
- a bit line;
- a memory array comprising a plurality of memory cells coupled to the bit line, wherein each of the plurality of memory cells comprises:
  - an access transistor having a gate coupled to a corresponding word line among the plurality of word lines, and
  - a data storage element configured to store a datum, wherein the access transistor and the data storage element are serially coupled between the bit line and a node of a reference voltage;
- a control circuit configured to supply, correspondingly through the plurality of word lines, a plurality of word line voltages, different from each other and lower than a threshold voltage of the access transistors, to the gates of the access transistors; and
- a current summation circuit configured to be coupled to the bit line, and to detect a bit line current on the bit line.

2. The memory device of claim 1, wherein
- the plurality of memory cells corresponds to a plurality of bits arranged in order of significance,
- the plurality of bits comprises a first bit and a second bit, the second bit higher than the first bit in the order of significance, and
- the control circuit is configured to supply, among the plurality of word line voltages,
  - a first word line voltage to the access transistor of a first memory cell among the plurality of memory cells, the first memory cell corresponding to the first bit, and
  - a second word line voltage to the access transistor of a second memory cell among the plurality of memory cells, the second memory cell corresponding to the second bit, the second word line voltage higher than the first word line voltage.

3. The memory device of claim 1, wherein
- the plurality of word line voltages are different from each other by multiples of a predetermined voltage difference.

4. The memory device of claim 1, wherein
- the control circuit is configured to supply the plurality of word line voltages, different from each other, to the access transistors of the plurality of memory cells to cause the access transistors to correspondingly generate different leakage currents when the plurality of memory cells stores bits of a first logic state.

5. The memory device of claim 4, wherein
- each leakage current among the different leakage currents is k times greater or smaller than another leakage current among the different leakage currents.

6. The memory device of claim 5, wherein
- k is 2.

7. The memory device of claim 1, further comprising:
- a sensing circuit; and
- a selection circuit coupled to the bit line, and configured to selectively couple the bit line
  - to the current summation circuit in a digital-to-analog conversion (DAC) operation in which the control circuit is configured to supply the plurality of word line voltages, different from each other, to the access transistors, and
  - to the sensing circuit in a read operation, in which the sensing circuit is configured to sense a bit stored in a memory cell among the plurality of memory cells.

8. The memory device of claim 1, wherein
- in each of the plurality of memory cells,
  - the data storage element is a capacitor having a first terminal electrically coupled to a first source/drain of the access transistor,
  - a second terminal of the capacitor is electrically coupled to one of the bit line and the node of reference voltage, and
  - a second source/drain of the access transistor is electrically coupled to the other of the bit line and the node of reference voltage.

9. The memory device of claim 1, further comprising:
- a temperature sensor configured to detect a temperature of the memory device in operation,
- wherein
- the plurality of word line voltages are different from each other by multiples of a predetermined voltage difference, and
- the control circuit is configured to adjust the voltage difference based on the temperature detected by the temperature sensor.

10. A memory device, comprising:
- a plurality of word lines;
- a bit line;
- a memory array comprising a plurality of memory cells coupled to the bit line, wherein each of the plurality of memory cells comprises an access transistor coupled to a corresponding word line among the plurality of word lines; and
- a control circuit configured to
  - supply a plurality of word line voltages correspondingly through the plurality of word lines to the access transistors of the plurality of memory cells; and,
- a temperature sensor configured to detect a temperature of the memory device in operation, wherein the plurality of word line voltages are different from each other by multiples of a predetermined voltage difference, and the control circuit is configured to adjust the voltage difference based on the temperature detected by the temperature sensor.

11. The memory device of claim 10, wherein the plurality of word line voltages is lower than a threshold voltage of the access transistors.

12. The memory device of claim 10, further comprising:

a storage circuit configured to store a relationship between different voltage data and corresponding different values of the temperature, wherein the control circuit is configured to adjust the voltage difference based on the temperature detected by the temperature sensor and the relationship stored in the storage circuit.

13. The memory device of claim 12, wherein the different voltage data comprise different values of the voltage difference corresponding to the different values of the temperature.

14. The memory device of claim 10, further comprising:

a further bit line, wherein the memory array further comprises a plurality of further memory cells coupled to the further bit line and the plurality of word lines, and the control circuit is configured to, before supplying the plurality of word line voltages correspondingly to the access transistors of the plurality of memory cells, copy data from the plurality of further memory cells to the plurality of memory cells.

15. A method, comprising:

in a computing-in-memory (CIM) operation of a memory device, accessing a plurality of memory cells of the memory device by supplying, to gates of access transistors of the plurality of memory cells, corresponding different gate voltages, and performing a computation based on individual currents flowing through the plurality of memory cells in response to the corresponding different gate voltages, wherein the plurality of memory cells corresponds to a plurality of bits arranged in order of significance, the plurality of bits comprises a first bit and a second bit, the second bit higher than the first bit in the order of significance, and the different gate voltages comprise:

a first gate voltage supplied to the access transistor of a first memory cell among the plurality of memory cells, the first memory cell corresponding to the first bit, and a second gate voltage supplied to the access transistor of a second memory cell among the plurality of memory cells, the second memory cell corresponding to the second bit, the second gate voltage higher than the first gate voltage.

16. The method of claim 15, wherein said CIM operation further comprises:

performing a summation of the individual currents to obtain an analog signal corresponding to digital data stored in the plurality of memory cells.

17. The method of claim 16, wherein said computation comprises:

multiplying the analog signal with further data read from a plurality of further memory cells of the memory device, the digital data stored in the plurality of memory cells comprise one of input data and weight data, and the further data read from the plurality of further memory cells comprise the other of the input data and the weight data.

18. The method of claim 15, wherein said CIM operation further comprises:

adjusting the corresponding different gate voltages supplied to the plurality of memory cells based on a temperature of the memory device.

19. The method of claim 15, wherein said CIM operation further comprises, before said accessing:

copying data from a plurality of further memory cells in the memory device to the plurality of memory cells, and said accessing comprises accessing the copied data.

20. The method of claim 15, wherein the different gate voltages are lower than a threshold voltage of the access transistors.

* * * * *